US012658899B1

(12) United States Patent

Yanamandra et al.

(10) Patent No.: US 12,658,899 B1
(45) Date of Patent: Jun. 16, 2026

(54) EFFICIENT PHASE ENCODING FOR CLOCK RECOVERY

(71) Applicant: Cadence Design Systems, Inc., San Jose, CA (US)

(72) Inventors: Satya Someswara Kaushik Yanamandra, Gaithersburg, MD (US); Benjamin L. Heilmann, Southport, NC (US); Douglas Scott Shelton, Kingsville, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 32 days.

(21) Appl. No.: 19/019,314

(22) Filed: Jan. 13, 2025

(51) Int. Cl.
*H03K 5/135* (2006.01)
*H03K 5/00* (2006.01)

(52) U.S. Cl.
CPC ... *H03K 5/135* (2013.01); *H03K 2005/00052* (2013.01); *H03K 2005/00286* (2013.01)

(58) Field of Classification Search
CPC ......... H03K 5/135; H03K 2005/00052; H03K 2005/00286
USPC ................................................ 327/237–259
See application file for complete search history.

(56) References Cited

U.S. PATENT DOCUMENTS

| 6,759,881 | B2 * | 7/2004 | Kizer | H03L 7/07 |
| | | | | 327/158 |
| 8,686,775 | B2 * | 4/2014 | Nedovic | H03K 5/13 |
| | | | | 327/357 |
| 10,333,533 | B1 * | 6/2019 | Moscone | H03H 11/00 |
| 11,569,804 | B1 * | 1/2023 | Lee | H03K 5/01 |
| 12,191,862 | B2 * | 1/2025 | Foley | H03K 5/13 |
| 2010/0026367 | A1 * | 2/2010 | Jiang | H03B 28/00 |
| | | | | 327/355 |
| 2014/0176213 | A1 * | 6/2014 | Rylov | H03K 5/131 |
| | | | | 327/237 |
| 2022/0224318 | A1 * | 7/2022 | Son | G06F 1/06 |
| 2025/0158623 | A1 * | 5/2025 | Pike | H03K 5/13 |

* cited by examiner

*Primary Examiner* — Tomi Skibinski
(74) *Attorney, Agent, or Firm* — Schwegman Lundberg & Woessner, P.A.

(57) ABSTRACT

Phase interpolation techniques for clock and data recovery in high-speed serial interfaces. A phase interpolator interpolates between four input clock signals phase-offset by 90 degrees to generate eight output clock signals phase-offset by 45 degrees. The phase interpolator includes primary and secondary mixers that adjust phase values using a mixed thermometer-binary encoding scheme. The primary mixers use most-significant-bit (MSB) thermometer bits for coarse steps and least-significant-bit (LSB) thermometer and binary bits for fine half-steps. The secondary mixers additionally employ boundary bits to maintain proper phase relationships across quadrant transitions. The encoding scheme can reduce routing complexity while preserving monotonic phase progression over the full 360-degree range.

20 Claims, 19 Drawing Sheets

602

604   RECEIVE INPUT CLOCK SIGNAL

606   GENERATE MULTIPLE CLOCK SIGNALS BASED ON INPUT CLOCK SIGNAL

608   GENERATE INJECTION SIGNALS WITH INVERSE STEP SIZE PROFILES BASED ON CLOCK SIGNALS

610   GENERATE OUTPUT CLOCK PHASES BASED ON INJECTION SIGNALS BY AVERAGING STEP SIZE PROFILES OF INJECTION SIGNALS

612   CONVERT OUTPUT CLOCK PHASES TO CMOS CLOCK PHASES

Mixer - I/Q

| Phase Code | Mixer I <127:0> | Mixer Q <255:128> | Mixer Ib <383:256> | Mixer Qb <511:384> | Output Phase |
|---|---|---|---|---|---|
| 0 | 128 | 0 | 0 | 0 | I-clock |
| 1 | 127 | 1 | 0 | 0 | |
| ........ | ........ | ........ | ........ | ........ | |
| 63 | 65 | 64 | 0 | 0 | |
| 64 | 64 | 64 | 0 | 0 | I45-clock |
| 65 | 63 | 65 | 0 | 0 | |
| ........ | ........ | ........ | ........ | ........ | |
| 511 | 127 | 0 | 0 | 1 | |

FIG. 9A

Mixer - I45/Q45

| Phase Code | Mixer I <448:511> <0:63> | Mixer Q <64:191> | Mixer Ib <192:319> | Mixer Qb <320:447> | Output Phase |
|---|---|---|---|---|---|
| 0 | 64 | 64 | 0 | 0 | I45-clock |
| 1 | 63 | 65 | 0 | 0 | |
| ........ | ........ | ........ | ........ | ........ | |
| 63 | 1 | 127 | 0 | 0 | |
| 64 | 0 | 128 | 0 | 0 | Q-clock |
| 65 | 0 | 127 | 1 | 0 | |
| ........ | ........ | ........ | ........ | ........ | |
| 511 | 65 | 63 | 0 | 0 | |

FIG. 9B

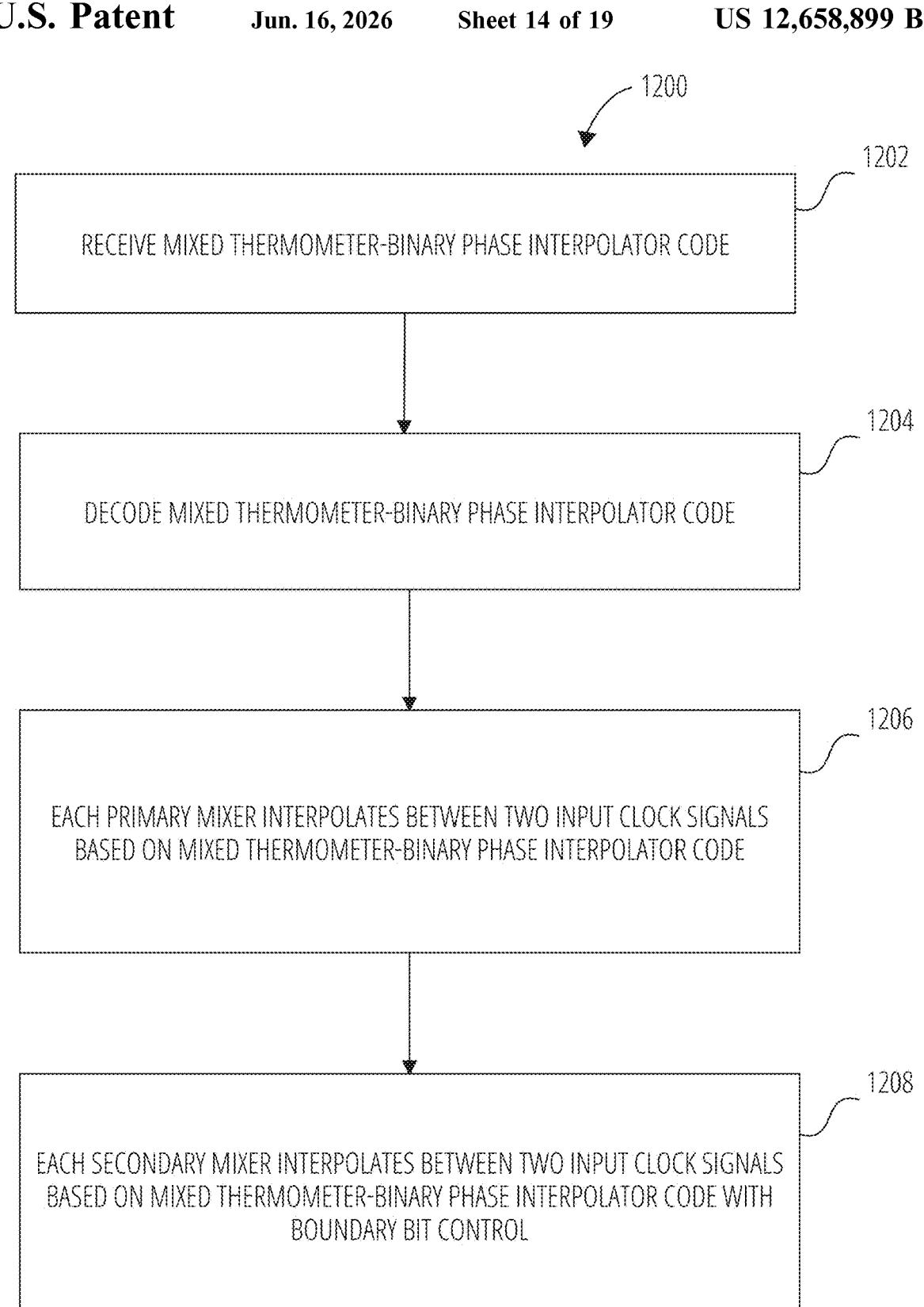

1200

1202

RECEIVE MIXED THERMOMETER-BINARY PHASE INTERPOLATOR CODE

1204

DECODE MIXED THERMOMETER-BINARY PHASE INTERPOLATOR CODE

1206

EACH PRIMARY MIXER INTERPOLATES BETWEEN TWO INPUT CLOCK SIGNALS
BASED ON MIXED THERMOMETER-BINARY PHASE INTERPOLATOR CODE

1208

EACH SECONDARY MIXER INTERPOLATES BETWEEN TWO INPUT CLOCK SIGNALS
BASED ON MIXED THERMOMETER-BINARY PHASE INTERPOLATOR CODE WITH
BOUNDARY BIT CONTROL

Figure 13:
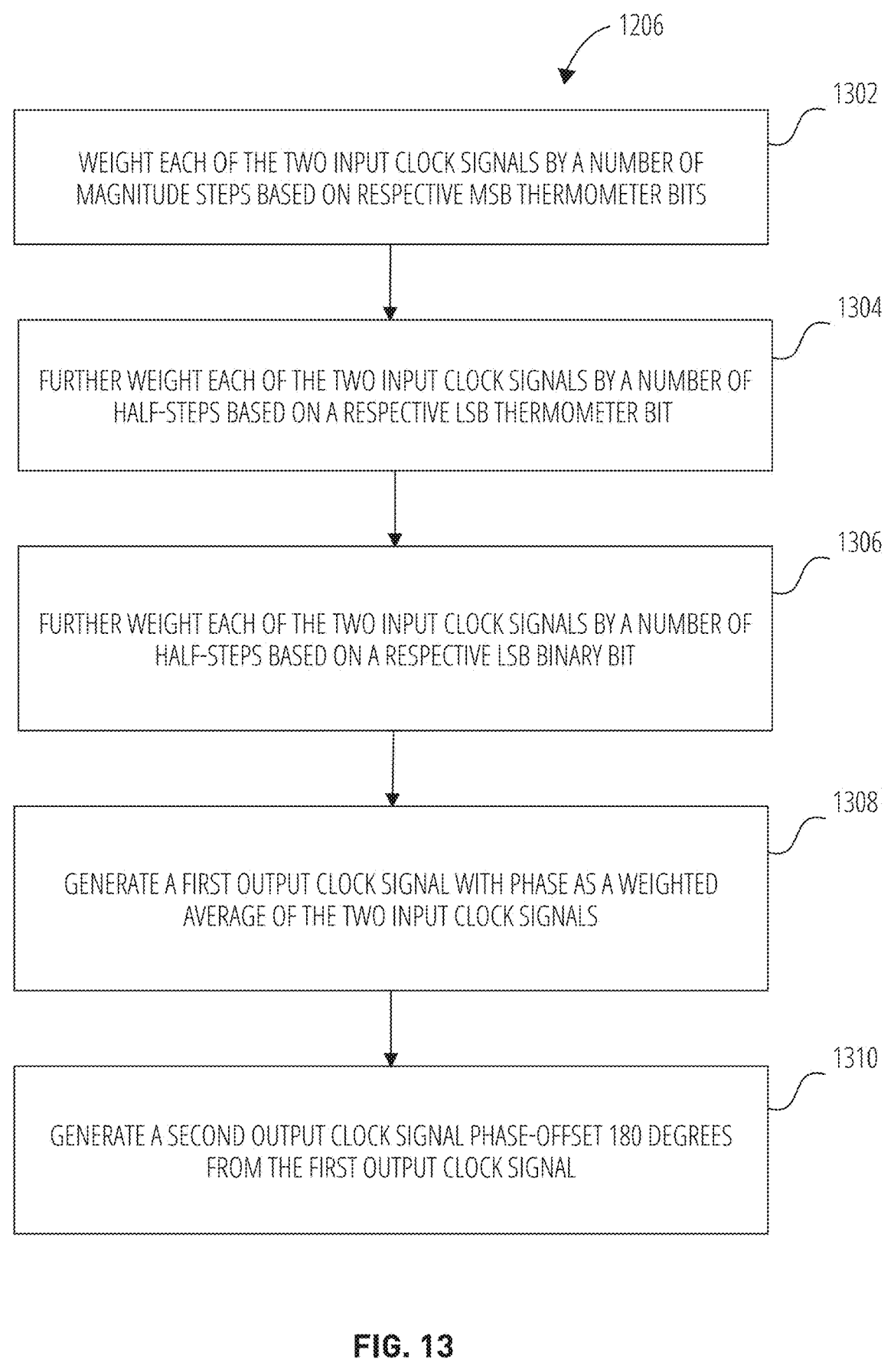

WEIGHT EACH OF THE TWO INPUT CLOCK SIGNALS BY A NUMBER OF MAGNITUDE STEPS BASED ON RESPECTIVE MSB THERMOMETER BITS

1304

FURTHER WEIGHT EACH OF THE TWO INPUT CLOCK SIGNALS BY A NUMBER OF HALF-STEPS BASED ON A RESPECTIVE LSB THERMOMETER BIT

1306

FURTHER WEIGHT EACH OF THE TWO INPUT CLOCK SIGNALS BY A NUMBER OF HALF-STEPS BASED ON A RESPECTIVE LSB BINARY BIT

1308

GENERATE A FIRST OUTPUT CLOCK SIGNAL WITH PHASE AS A WEIGHTED AVERAGE OF THE TWO INPUT CLOCK SIGNALS

1310

GENERATE A SECOND OUTPUT CLOCK SIGNAL PHASE-OFFSET 180 DEGREES FROM THE FIRST OUTPUT CLOCK SIGNAL

Figure 14:
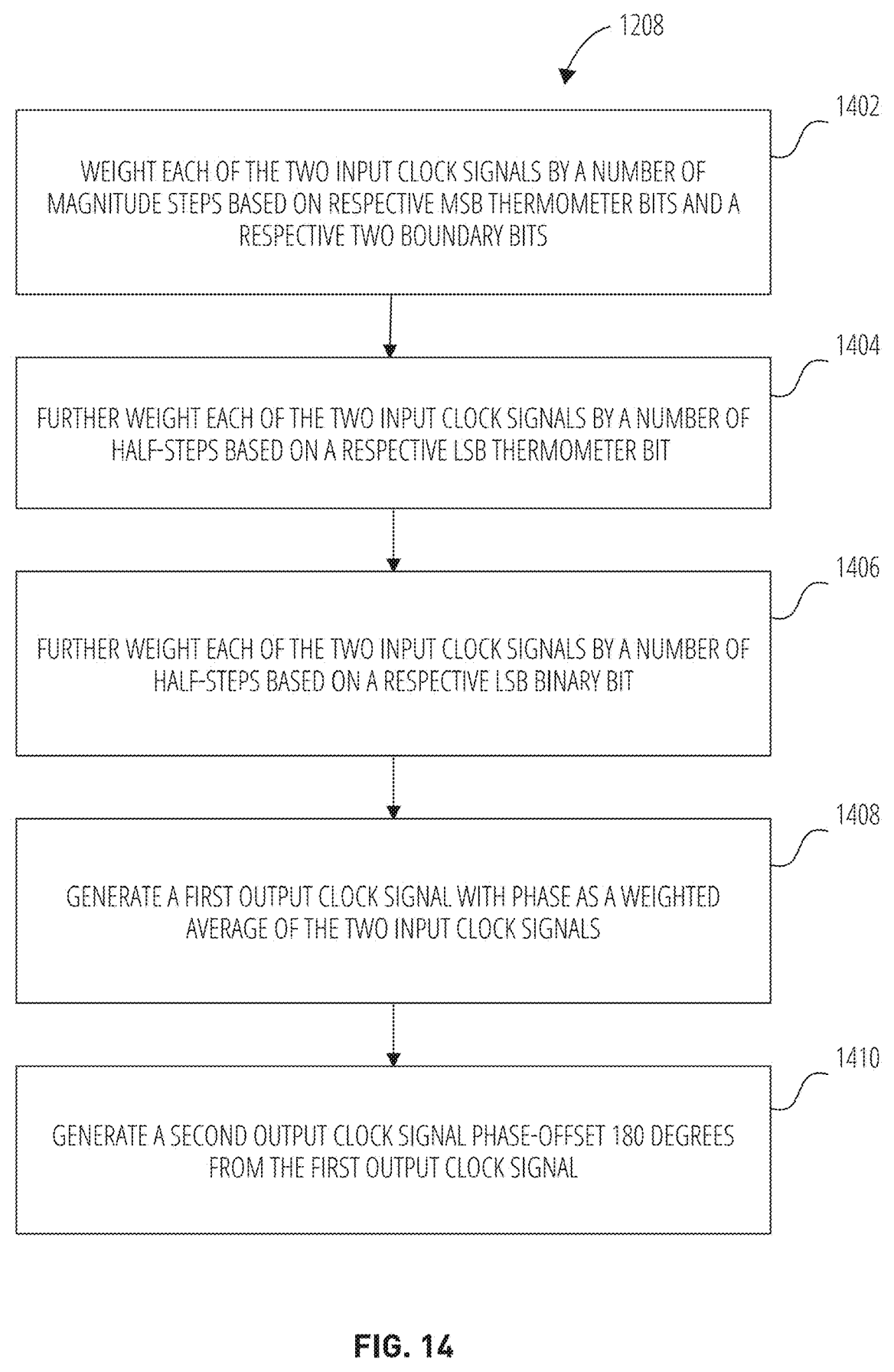

WEIGHT EACH OF THE TWO INPUT CLOCK SIGNALS BY A NUMBER OF MAGNITUDE STEPS BASED ON RESPECTIVE MSB THERMOMETER BITS AND A RESPECTIVE TWO BOUNDARY BITS

1404

FURTHER WEIGHT EACH OF THE TWO INPUT CLOCK SIGNALS BY A NUMBER OF HALF-STEPS BASED ON A RESPECTIVE LSB THERMOMETER BIT

1406

FURTHER WEIGHT EACH OF THE TWO INPUT CLOCK SIGNALS BY A NUMBER OF HALF-STEPS BASED ON A RESPECTIVE LSB BINARY BIT

1408

GENERATE A FIRST OUTPUT CLOCK SIGNAL WITH PHASE AS A WEIGHTED AVERAGE OF THE TWO INPUT CLOCK SIGNALS

1410

GENERATE A SECOND OUTPUT CLOCK SIGNAL PHASE-OFFSET 180 DEGREES FROM THE FIRST OUTPUT CLOCK SIGNAL

| Code (1506) | Mixer I Phase MSB <63:0> (1508) | Mixer I Phase LSB (1510) | Mixer Q Phase MSB <127:64> (1508) | Mixer Q Phase LSB (1510) | Mixer IB Phase MSB <191:128> (1508) | Mixer IB Phase LSB (1510) | Mixer QB Phase MSB <255:192> (1508) | Mixer QB Phase LSB (1510) |
|---|---|---|---|---|---|---|---|---|
| 0 | 64 | 0 | 0 | 0 | 0 | 0 | 0 | 0 |
| 1 | 63 | 1 | 0 | 1 | 0 | 0 | 0 | 0 |
| 2 | 63 | 0 | 1 | 0 | 0 | 0 | 0 | 0 |
| ... | ... | ... | ... | ... | ... | ... | ... | ... |
| 62 | 33 | 0 | 31 | 0 | 0 | 0 | 0 | 0 |
| 63 | 32 | 1 | 31 | 1 | 0 | 0 | 0 | 0 |
| 64 | 32 | 0 | 32 | 0 | 0 | 0 | 0 | 0 |
| 65 | 31 | 1 | 32 | 1 | 0 | 0 | 0 | 0 |
| ... | ... | ... | ... | ... | ... | ... | ... | ... |
| 126 | 1 | 0 | 63 | 0 | 0 | 0 | 0 | 0 |
| 127 | 0 | 1 | 63 | 1 | 0 | 0 | 0 | 0 |
| 128 | 0 | 0 | 64 | 0 | 0 | 0 | 0 | 0 |
| 129 | 0 | 0 | 63 | 1 | 0 | 1 | 0 | 0 |
| ... | ... | ... | ... | ... | ... | ... | ... | ... |

| Code (1506) | Mixer I Phase MSB <224:255> <0:31> (1508) | Mixer I-45 Phase LSB (1510) | Mixer Q Phase MSB <32:63> <64:95> (1508) | Mixer Q-45 Phase LSB (1510) | Mixer Ib Phase MSB <96:127> <128:159> (1508) | Mixer Ib-45 Phase LSB (1510) | Mixer Qb Phase MSB <160:191> <192:223> (1508) | Mixer Qb-45 Phase LSB (1510) |
|---|---|---|---|---|---|---|---|---|
| 0 | 32 | 0 | 32 | 0 | 0 | 0 | 0 | 0 |
| 1 | 31 | 1 | 32 | 1 | 0 | 0 | 0 | 0 |
| 2 | 31 | 0 | 33 | 0 | 0 | 0 | 0 | 0 |
| ... | ... | ... | ... | ... | ... | ... | ... | ... |
| 62 | 1 | 0 | 63 | 0 | 0 | 0 | 0 | 0 |
| 63 | 0 | 1 | 63 | 1 | 0 | 0 | 0 | 0 |
| 64 | 0 | 0 | 64 | 0 | 0 | 1 | 0 | 0 |
| 65 | 0 | 0 | 63 | 1 | 0 | 0 | 0 | 0 |
| ... | ... | ... | ... | ... | ... | ... | ... | ... |
| 126 | 0 | 0 | 33 | 0 | 31 | 0 | 0 | 0 |
| 127 | 0 | 0 | 32 | 1 | 31 | 1 | 0 | 0 |
| 128 | 0 | 0 | 32 | 0 | 32 | 0 | 0 | 0 |
| 129 | 0 | 0 | 31 | 1 | 32 | 1 | 0 | 0 |
| ... | ... | ... | ... | ... | ... | ... | ... | ... |

EFFICIENT PHASE ENCODING FOR CLOCK RECOVERY

TECHNICAL FIELD

The present disclosures relate to high-speed serial interfaces and, in some examples, to phase interpolators, systems, and methods to efficiently encode and decode phase interpolator control signals for clock and data recovery in multi-gigabit rate receivers.

BACKGROUND

High-speed serial interfaces enable data communication between integrated circuits at multi-gigabit rates. These interfaces employ clock and data recovery circuits in receivers to properly sample incoming data streams by aligning clock phases. Phase interpolation techniques allow precise clock phase adjustment through digital control, with implementations including current mode logic (CML), voltage mode, and charge-based approaches. Modern serializer/deserializer (SerDes) receivers utilize analog-to-digital converters (ADCs) to sample data at high rates, supporting protocols like PCI Express that operate across multiple data rates.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 9A and FIG. 9B illustrate mixer encoding tables for primary I/Q and secondary I45/Q45 mixers using conventional thermometer encoding.

FIG. 12 is a flow diagram illustrating operations for controlling a phase interpolator, according to some examples.

FIG. 13 is a flow diagram illustrating operations for implementing primary mixer interpolation, according to some examples.

FIG. 14 is a flow diagram illustrating operations for implementing secondary mixer interpolation, according to some examples.

FIG. 15A and FIG. 15B illustrate alternative mixer encoding tables, according to some examples.

DETAILED DESCRIPTION

Figure 1:
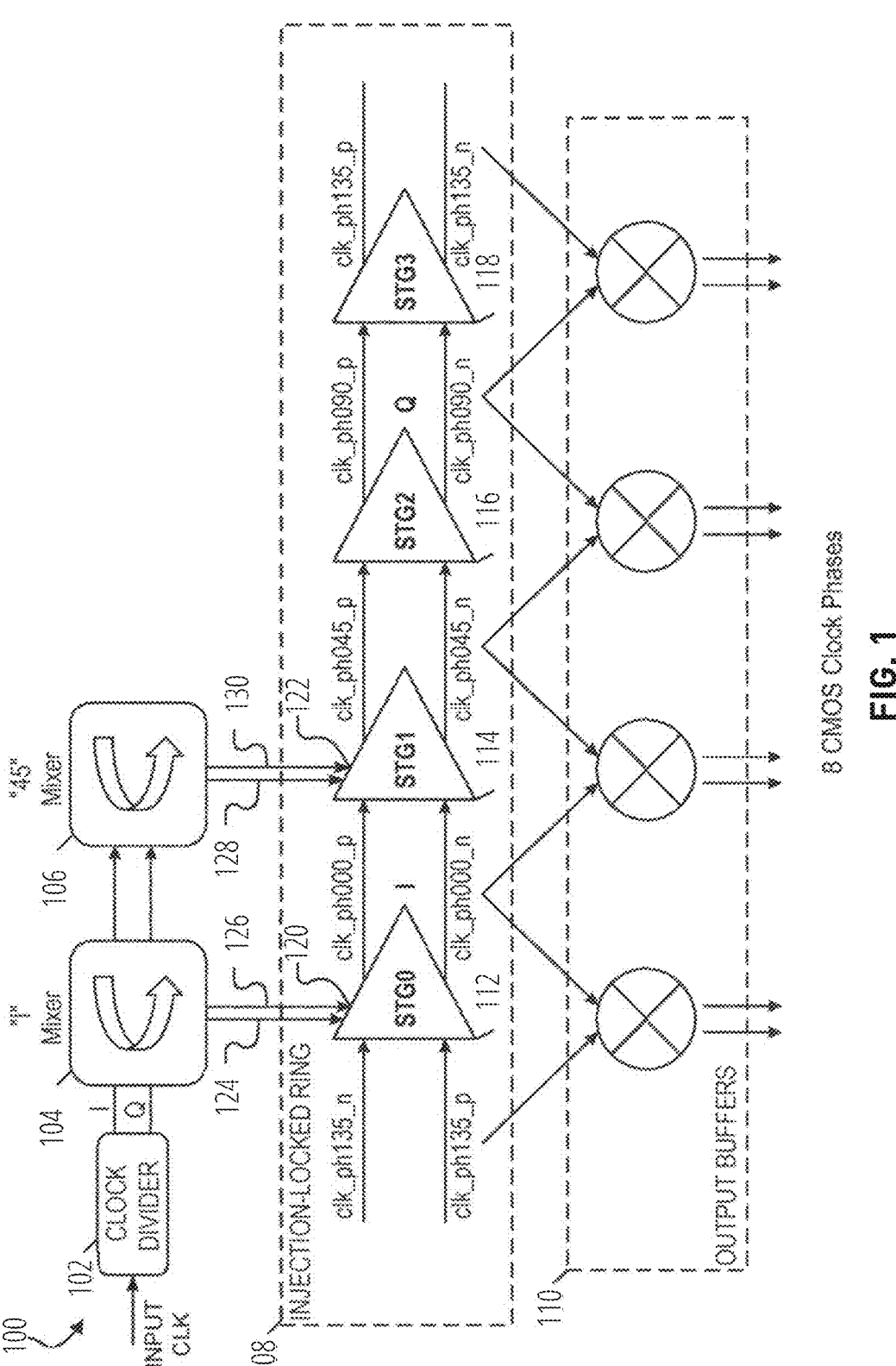
FIG. 1 is a circuit diagram illustrating a hybrid phase interpolator, according to some examples.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

The described examples relate to phase interpolation techniques for high-speed serial interfaces, particularly focusing on an efficient encoding scheme for generating multiple clock phases.

High-speed serial interfaces enable data communication between integrated circuits at multi-gigabit rates. These interfaces employ clock and data recovery circuits in receivers to properly sample incoming data streams by aligning clock phases.

Phase interpolation allows precise clock phase adjustment through digital control, with implementations including current mode logic (CML), voltage mode, and charge-based approaches. The examples describe a hybrid phase interpolator architecture that generates eight output clock phases from four input clock signals. The architecture comprises several key components:

A clock divider receives an input clock signal and generates in-phase (I) and quadrature (Q) clock signals that are 90 degrees apart. The clock divider may also generate inverse versions of these signals.

Two primary mixers (an I-mixer and a Q-mixer) and two secondary mixers (an I45-mixer and a Q45-mixer) interpolate between pairs of the four input clock signals using a mixed thermometer-binary phase interpolator code. Each mixer adjusts phase values through a combination of most-significant-bit (MSB) thermometer bits for coarse steps and least-significant-bit (LSB) thermometer and binary bits for fine half-steps.

An injection-locked ring receives injection signals from the mixers and generates output clock phases. The ring comprises multiple delay stages that each contribute a finite delay. The injection signals have inverse step size profiles, which the ring averages to produce constant step sizes in the output phases.

Output buffers convert the generated clock phases to a digital format (e.g., using a complementary metal-oxidesemiconductor (CMOS) transistor architecture) and provide additional skew correction through blending techniques.

The examples described herein may address one or more technical challenges in phase interpolator design.

In some examples, area efficiency can be improved through a mixed thermometer-binary encoding scheme, potentially using additional boundary bits to supplement the MSB thermometer bits for the secondary mixers, that reduces the number of control signals needed. Traditional implementations use pure thermometer encoding, which requires routing many signals, such as at least twice as many signals as in example described herein. These signals are routed from a digital to analog interface, which tends to consume a large amount of power and area overhead, especially for clock and data recovery phase interpolator (CDR-PI) designs requiring a fine step resolution.

In some examples, 45-degree phase shifts can be used between mixers of the phase interpolator instead of 90-degree phase shifts.

In some examples, power efficiency is achieved through current and resistance scaling based on operating frequency. At lower frequencies, current is reduced and resistance increased to maintain proper common mode voltage while reducing power consumption.

In some examples, the architecture of the phase interpolator can support a wide range of data rates and protocols. In some examples, the architecture can support 1-80 Gb/s data rates with a phase interpolator operating at 2-10 GHz, compatible with protocols such as PCIe, Ethernet, and so on. For example, PCIe uses a 4-8 GHz phase interpolator range for a 2.5-64 Gb/s data rate operation, whereas a wider phase interpolator range can be used to enable support for other standards.

In some examples, the mixed thermometer-binary encoding of the phase interpolator codes is a mixed thermometer-binary-boundary encoding that uses:

252 MSB thermometer bits,
  8 LSB thermometer bits,
  8 LSB binary bits, and
  8 boundary bits.

This encoding scheme maintains monotonicity of the thermometer bits (including the boundary bits) across a 360-degree phase span while allowing more compact representation through binary bits than conventional 512-bit thermometer encoding schemes. The boundary bits help prevent phase offset issues when transitioning between quadrants. In some examples, a 256-bit encoding scheme is used. The number of bits used to encode the phase interpolator code can be selected based on the input clock frequency to the phase interpolator and the phase step resolution requirement. Thus, other examples may differ in the number of bits used to encode the phase interpolator code. The phase interpolator step resolution requirement can be selected based on factors such as jitter tolerance mask targets, CDR gain, and bandwidth requirements. Furthermore, PAM-4 systems also generally require lower phase resolution compared to non-return to zero (NRZ) systems.

The described techniques can be implemented in various ways, including different mixer configurations and blending approaches. The example encoding schemes described herein may provide particular advantages for analog-to-digital converter (ADC) based receivers operating at multi-gigabit rates.

Figure 7:
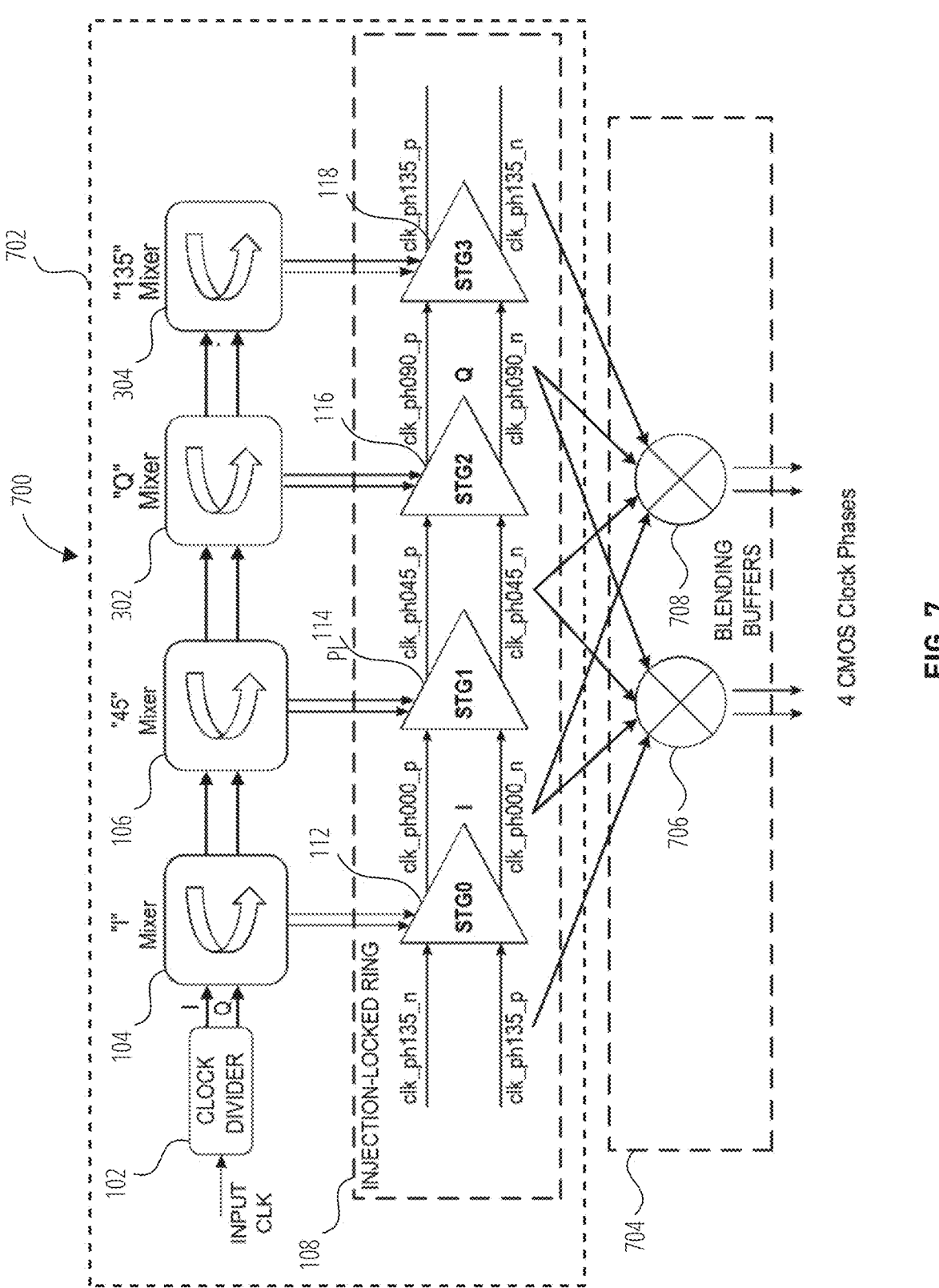
FIG. 7 is a block diagram illustrating a blending hybrid phase interpolator with blending buffers, according to some examples.
Figure 8A:
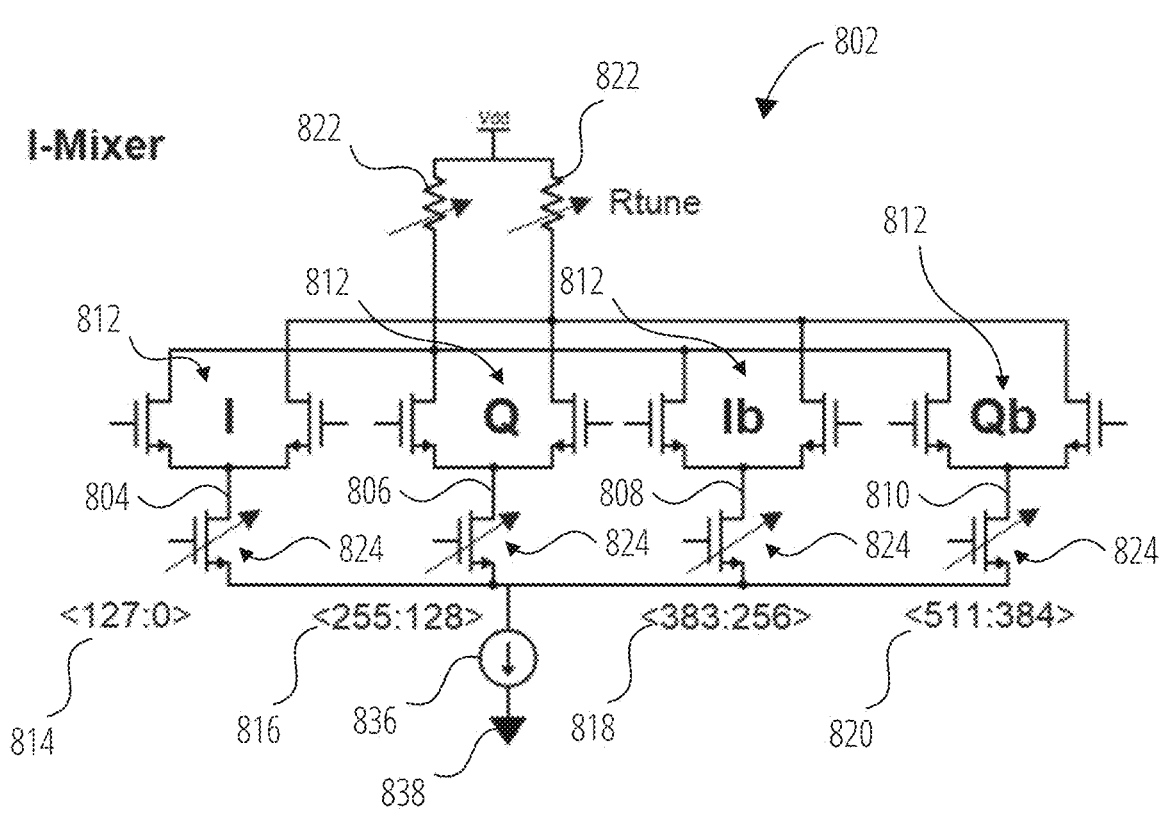
FIG. 8A and FIG. 8B illustrate circuit implementations of I-mixer and I45-mixer configurations, according to some examples.
Figure 8B:
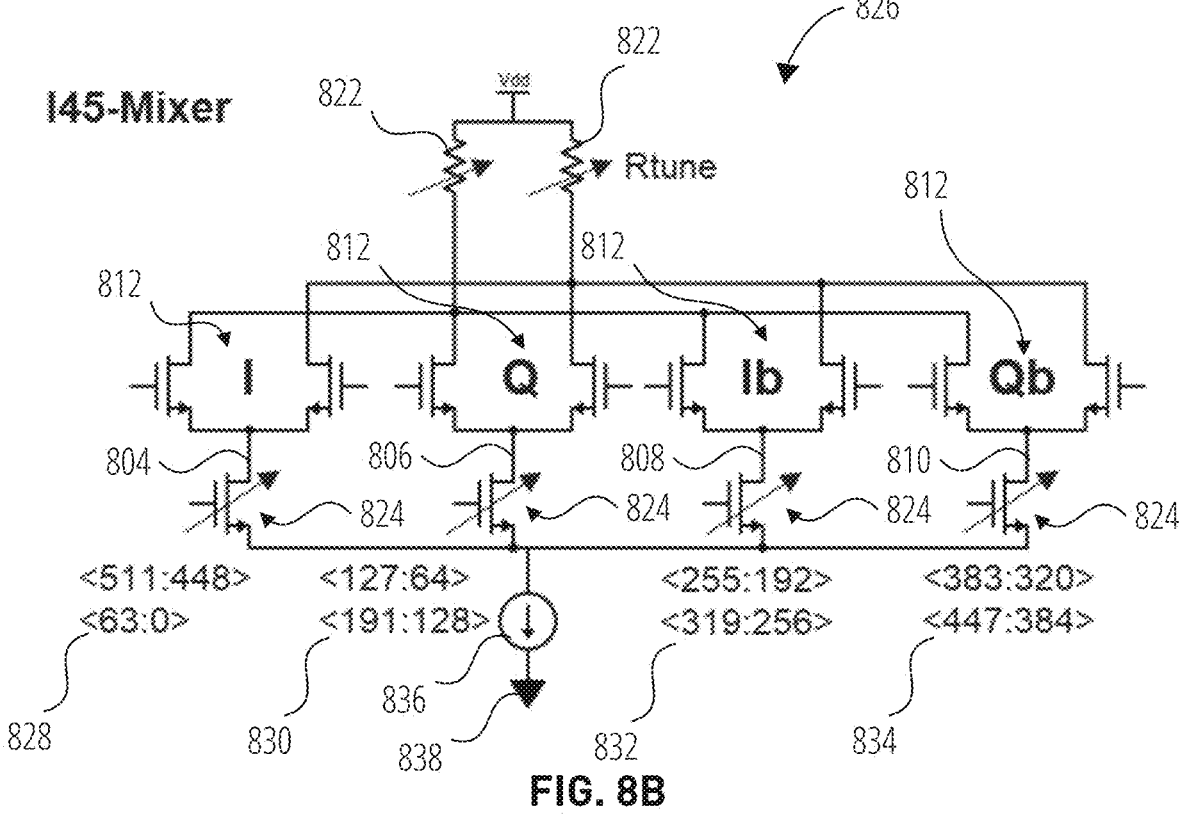
Figures 10A, 10B:
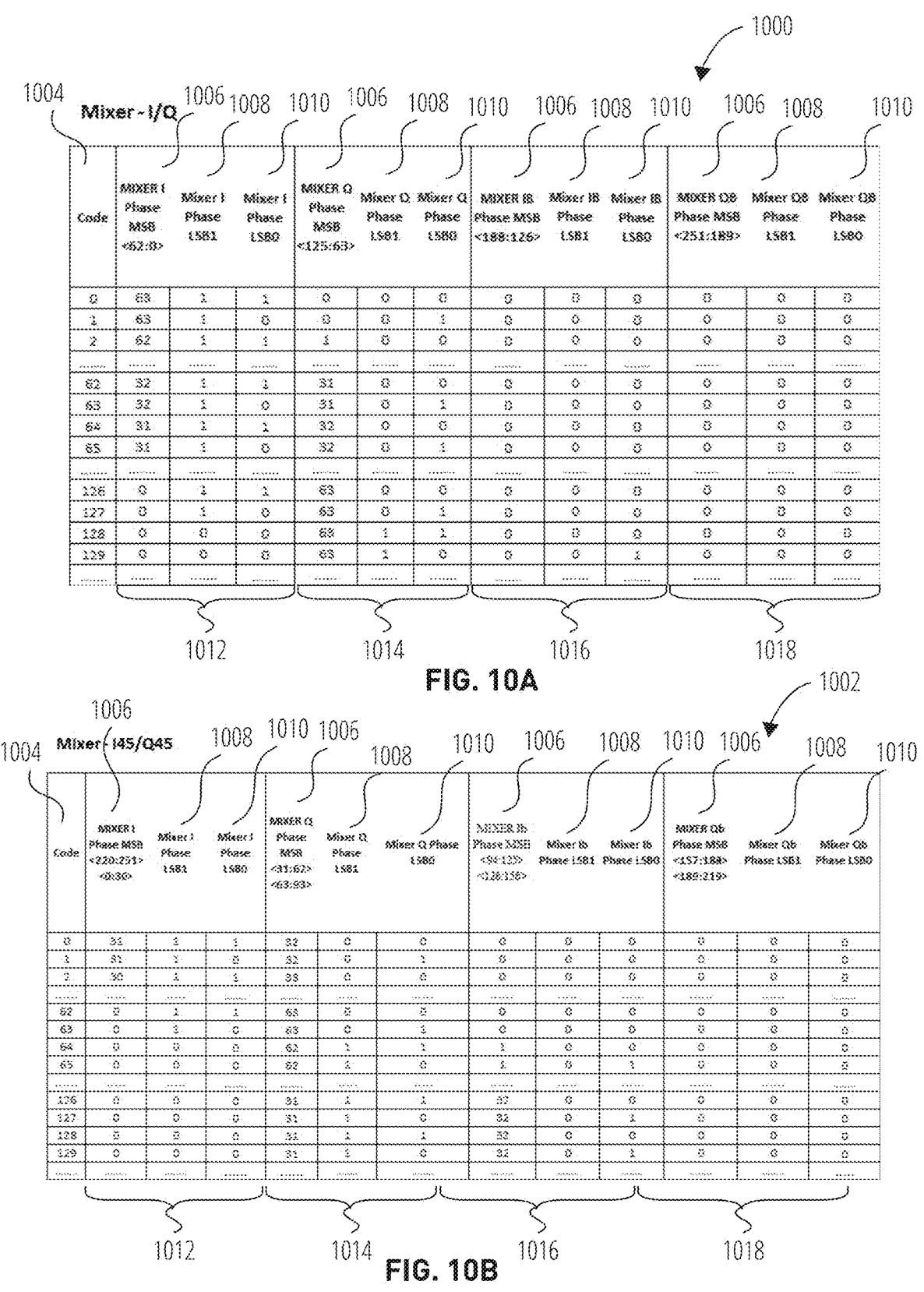
FIG. 10A and FIG. 10B illustrate mixer encoding tables using mixed thermometer-binary encoding, according to some examples.
Figure 16:
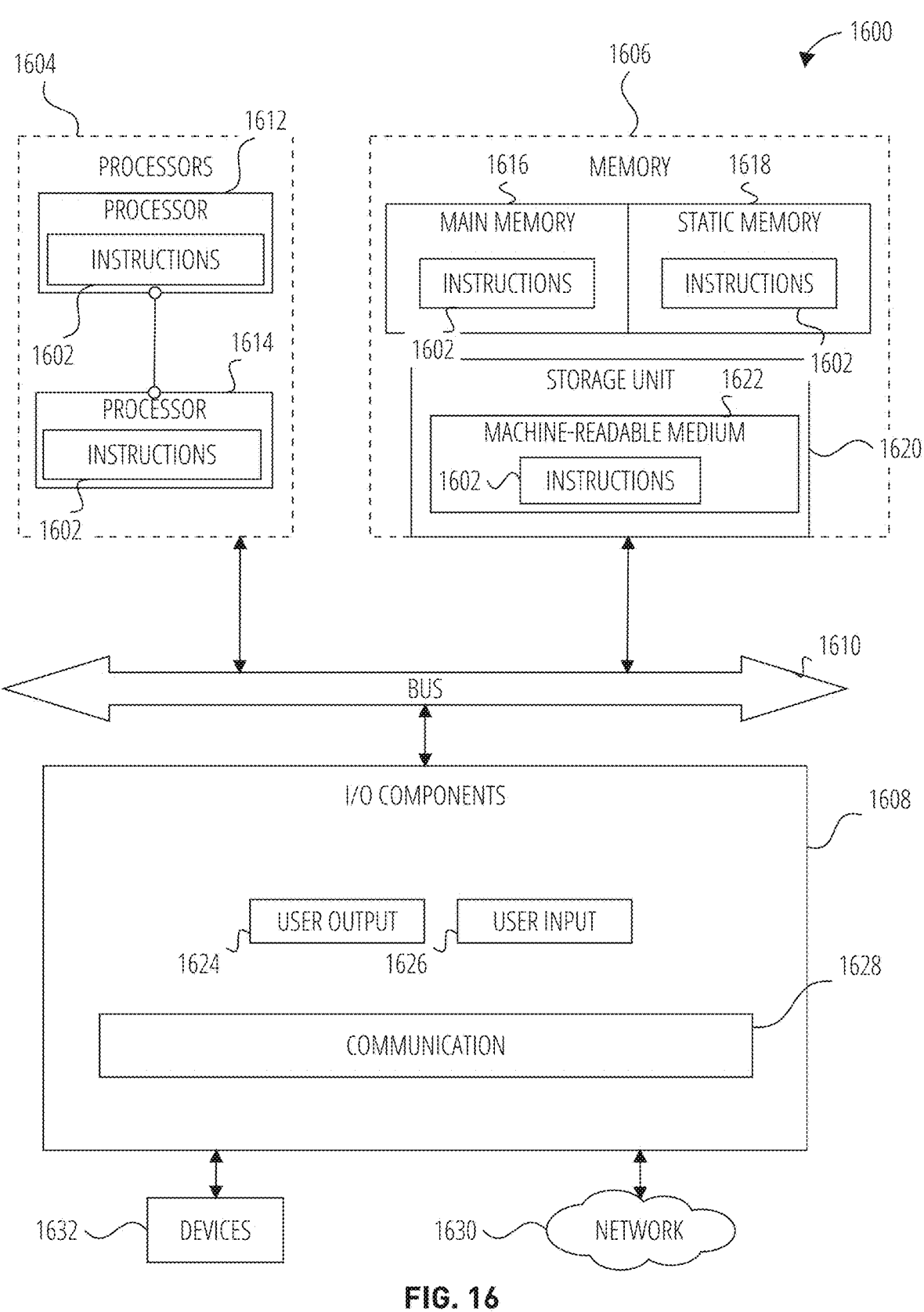
FIG. 16 is a diagrammatic representation of a machine in the form of a computer system within which a set of instructions may be executed to cause the machine to perform any one or more of the methodologies discussed herein, according to some examples.

Examples will now be described with reference to the figures. FIG. 1 through FIG. 6 show examples of a hybrid PI as generally disclosed in the Moscone reference. FIG. 7 shows a further refinement of the blender used by a hybrid PI. FIG. 8A and FIG. 8B shows circuit implementations of the primary mixers and secondary mixers of the hybrid phase interpolator. Examples of three different phase interpolator code encoding schemes are described with reference to: FIG. 9A-FIG. 9B (a thermometer encoding); FIG. 10A-FIG. 10B (a mixed thermometer-binary encoding); and FIG. 11A-FIG. 11C (a mixed thermometer-binary-boundary encoding). FIG. 12 through FIG. 14 are flowcharts showing operations of example methods of decoding the examples encoding schemes to interpolate between pairs of the input clock signals to generate the output clock signals. FIG. 15A-FIG. 15B show mixer encoding tables for an alternative mixed thermometer-binary encoding scheme. FIG. 16 shows a machine potentially suited for implementation of one or more of the control and/or signal generation operations described herein.

With reference to FIG. 1, a hybrid phase interpolator 100 is shown. As shown, the hybrid phase interpolator 100 comprises a clock divider 102, phase interpolator mixers 104 and 106, an injection-locked ring 108, and output buffers 110. The hybrid phase interpolator 100, and variants and related techniques described below with reference to FIG. 2 through FIG. 6, corresponds to the hybrid PI described in the Moscone reference cited above.

The clock divider 102 receives an input clock signal at its input. The clock divider 102 generates an in-phase (I) clock signal (also referred to herein as the "I clock") and a quadrature (Q) clock signal (also referred to herein as the "Q clock") based on the input clock signal. The I clock corresponds to the input clock signal and the Q clock corresponds to a 90-degree phase shift of the input clock signal. The clock divider 102 provides the I clock at a first output and provides the Q clock at a second output. Although not illustrated in FIG. 1, the clock divider 102 may further generate and provide an inverse I clock (referred to herein as "‾I clock") and an inverse of the Q clock (referred to herein as "‾Q clock").

The outputs of the clock divider 102 are connected to inputs of the phase interpolator mixers 104 and 106 (although the direct connections of the clock divider 102 outputs to the interpolator mixer 106 are not shown for visual simplicity). The phase interpolator mixers 104 and 106 receive the I and Q clocks at their respective inputs. The phase interpolator mixers 104 and 106 use the I and Q clocks to generate injection signals to drive the injection-locked ring 108 based on different combinations of the I and Q clocks. The phase interpolator mixer 104 generates an injection signal 124 by mixing the clock signals according to a 100/0 mixing ratio (e.g., 100% of the I clock and 0% of the Q clock) to produce an injection signal that is in-phase with the I clock. The phase interpolator mixer 104 also generates an injection signal 126 that is the inverse of the injection signal 124 and is thereby in-phase with the ‾I clock. The phase interpolator mixer 106 generates an injection signal 128 by mixing the clock signals according to a 50/50 mixing ratio (e.g., 50% of the I clock and 50% of the Q clock) to produce an injection signal that is phase offset with the I clock by 45 degrees. The phase interpolator mixer 106 also generates an injection signal 130 that is an inverse of the injection signal 128.

Figure 2:
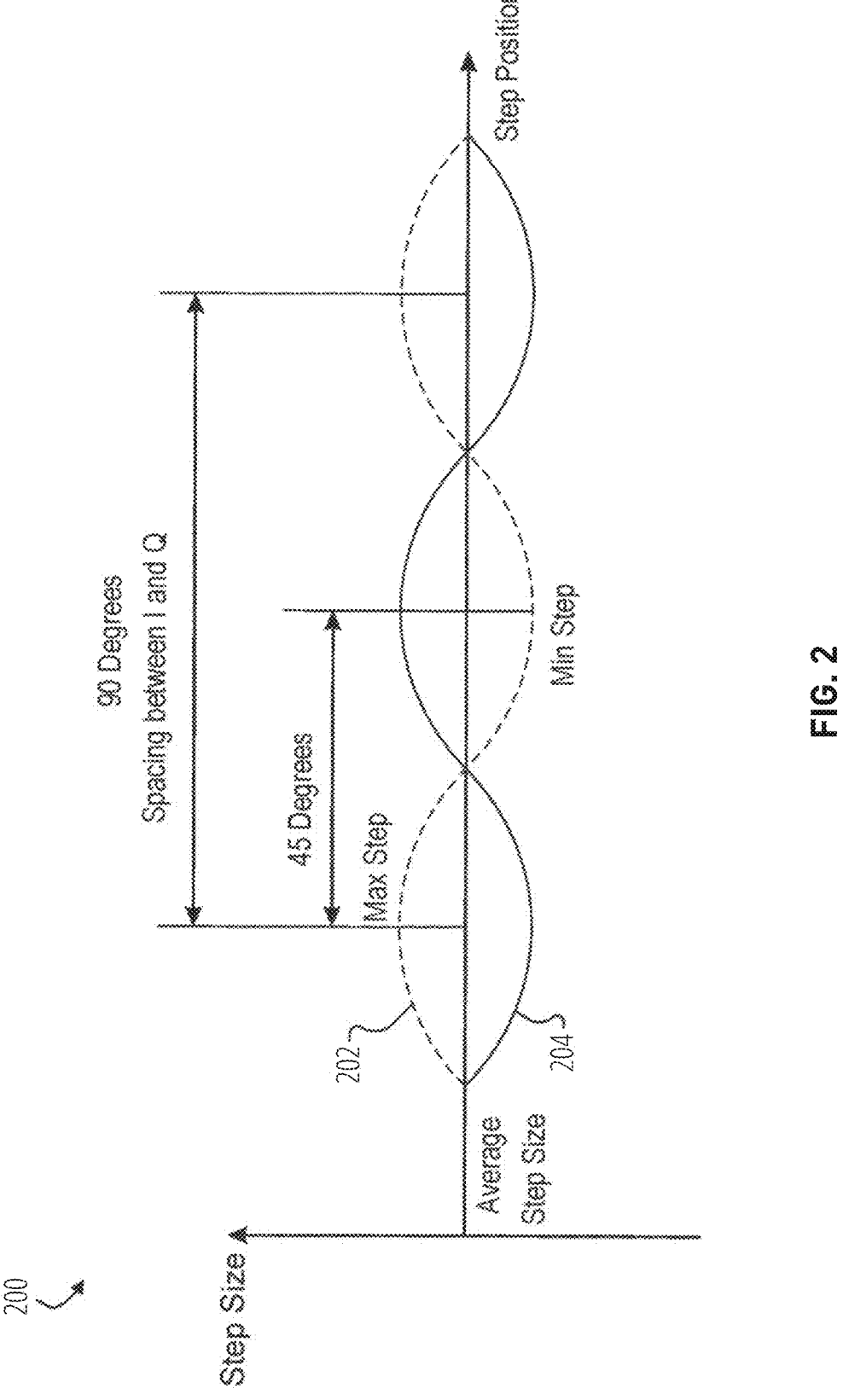
FIG. 2 is a plot illustrating step size curves associated with output signals of two phase interpolator mixer phase interpolators, which are included as part of the hybrid phase interpolators, according to some examples.

The injection signal 124 and injection signal 128 generated by the phase interpolator mixers 104 and 106, respectively, have inverse step size profiles. As a corollary, injection signal 126 and injection signal 130, which are simply the inverses of injection signal 124 and injection signal 128, also have inverse step size profiles. As used herein, a "step size profile" is a characteristic of an injection signal that describes a relationship between step size and phase position. As an example, FIG. 2 illustrates step size profiles of the injection signals output by the phase interpolator mixers 104 and 106. More specifically, in FIG. 2, a graph 200 of step size versus phase position is illustrated. Step size curves 202 and 204 are plotted within the graph 200. Step size curve 202 represents the step size profile of the injection signal 124 output by the phase interpolator mixer 104 and step size curve 204 represents the step size profile of the injection signal 128 output by the phase interpolator mixer 106. As shown, the step size curve 202 is an inverse of the step size curve 204. That is, the relationship between step size and phase position in the injection signal 124 is the inverse of the relationship between step size and phase position in the injection signal 128.

Returning to FIG. 1, the phase injection signal 124 and injection signal 126 provide the injection signals at their respective outputs. The outputs of the phase interpolator mixers 104 and 106 are connected to injection points of the injection-locked ring 108, and the injection-locked ring 108 generates output clock phases based on the injection signals provided by the phase interpolator mixers 104 and 106. By properly combining offset phase step curves in the phase interpolator mixers 104 and 106 with phase averaging provided by an injection-locked ring 108, a first order DNL and INL correction is achieved in the output clock phases. Rotational IQ skew errors generated by the phase interpolator mixers 104 and 106 are largely corrected in the injection-locked ring 108.

The injection-locked ring 108 comprises multiple delay stages. As shown, the injection-locked ring 108 comprises delay stages 112 to 118. Each of the delay stages 112 to 118 comprises at least one injection point.

The injection-locked ring 108 generates a characteristic oscillator signal. Each of the delay stages 112 to 118 contributes a finite delay, such that a time-delayed, or phase offset, version of the oscillator signal is established after each delay stage. Each of the delay stages 112 to 118 is of identical structure and configuration. Therefore, each of the delay stages 112 to 118 applies the same finite delay. The number of delay stages determines the amount of phase shift of each stage.

The oscillator signal undergoes a half cycle (0°-180°) total phase shift as it effectively 'travels' through the intervening delay stages in the first half of the injection-locked ring loop (e.g., clock signals Clk_0_p, Clk_45_p, Clk_90_p, Clk_135_p). Similarly, the oscillator signal undergoes the remaining half cycle of phase shift (180°-360°) as it effectively 'travels' the other half of the injection-locked ring loop (e.g., clock signals Clk_0_n, Clk_45_n, Clk_90_n, Clk_135_n). Thus, each half cycle is divided by n stage-to-stage phase shifts, or by a phase shift of 180°/n. Therefore, because four delay stages are employed, each delay stage would contribute a predetermined phase difference of 180°/4 or 45°.

As shown, the output of phase interpolator mixer 104 is connected to injection point 120 of the delay stage 112 and the output of phase interpolator mixer 106 is connected to injection point 122 of the delay stage 114. Accordingly, the injection signal 124 and injection signal 126 are injected into the injection point 120 of the delay stage 112, and the injection signal 128 and injection signal 130 are injected into the injection point 122.

The injection of the injection signal 124 and injection signal 126 to the injection point 120 causes the generated oscillator signal of the injection-locked loop to lock in both frequency and phase with the injection signal 124 and injection signal 126. Injection locking generally occurs when an oscillator operating at a certain frequency (e.g., the injection-locked ring 108) is disturbed by a second oscillator operating at a different but very close frequency (e.g., the injection signal 124 and injection signal 126) such that the coupling effects yield a locking of the first oscillator to the second oscillator. If the frequencies are sufficiently close and the coupling sufficiently strong, such injection locking will consistently occur in much the same manner that the vibrating strings of two instruments will eventually synchronize in vibration frequency if they are similarly tuned and drawn close enough together.

Because the injection signal 124 and injection signal 126 are injected at the delay stage 112, the injection-locked version of the oscillator signal resulting at the delay stage 112 is in-phase with the injection signal 124 and injection signal 126. Accordingly, after the first delay stage 112, the oscillator signal at the first half of the loop (i.e., Clk_0_p) and the other half of the loop (i.e., Clk_0_n) is not delayed with respect to the injection signal 124 and injection signal 126. Further, the injection-locked versions of the oscillator signal after the other delay stages would be accordingly referenced in phase to the first delay stage 112. For example, after the second delay stage 114, the oscillator signal at the first half of the loop (i.e., Clk_45_p) and the other half of the loop (i.e., Clk_45_n) is delayed by 45°. Similarly, after the third delay stage 116 and fourth delay stage 118, the oscillator signal is delayed by 90° and 135°, respectively.

At injection point 120, as the phase interpolator mixer 104 rotates, large phase steps eventually turn into smaller steps. Correspondingly at injection point 122, as the phase interpolator mixer 106 rotates, small phase steps eventually turn into larger steps because, as noted above, the step size profile of the injection signal provided by the phase interpolator mixer 106 is the inverse of the step size profile of the injection signal provided the phase interpolator mixer 104. The injection-locked ring 108 rotates in such a manner that its instantaneous phase rotation value is equal to the average value of the two steps applied to the injection points 120 and 122, thereby producing the first-order step size correction, and corresponding INL improvement in the output clock phases generated by the injection-locked ring 108.

The injection-locked ring 108 is configured to be a phase-follower only; it does not inherently rotate. By not inherently rotating, the injection-locked ring 108 does not add any DNL, INL, or interphase skew errors back into the output clock phases.

The injection-locked ring 108 provides the output clock phases at its outputs. The outputs of the injection-locked ring 108 are connected to inputs of the output buffers 110. The output buffers 110 provide a second stage of skew correction through utilization of one or more blending techniques. The output buffers 110 further convert the output clock phases generated by the injection-locked ring 108 to complementary metal-oxide-semiconductor (CMOS) clock phases.

Figure 3:
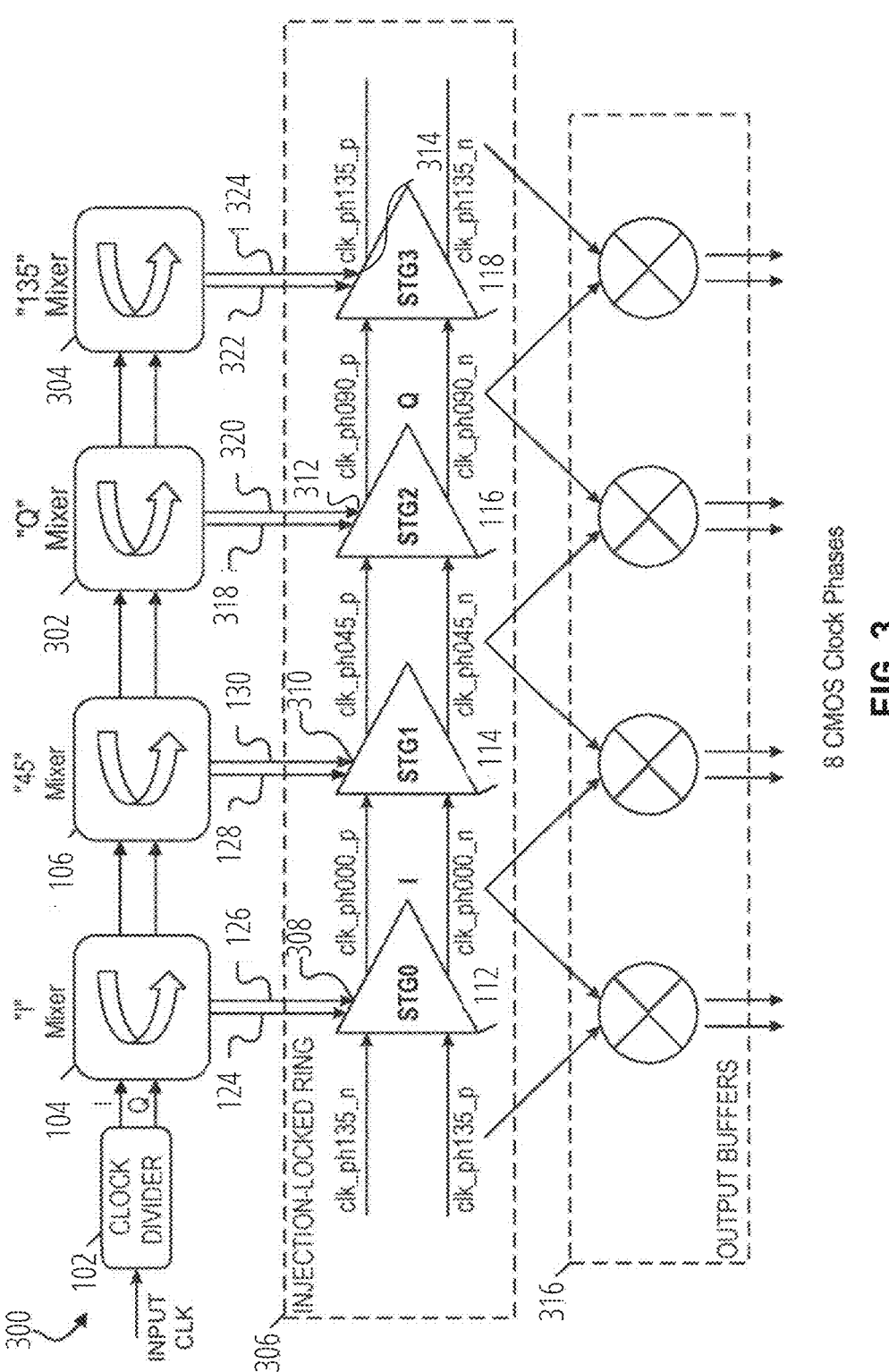
FIG. 3 is a circuit diagram illustrating a hybrid phase interpolator, according to some examples.

As shown in FIG. 3, a variant hybrid phase interpolator 300 of the hybrid phase interpolator 100 of FIG. 1 may, in some embodiments, further include phase interpolator mixers 302 and 304. As with the phase interpolator mixers 104 and 106, the phase interpolator mixers 302 and 304 receive the I and Q clocks at their respective inputs and use the I and Q clocks to generate injection signals to drive the injection-locked ring 306 based on different combinations of the I and Q clocks. In particular, the phase interpolator mixer 302 generates an injection signal 318 by mixing the clock signals according to a 0/100 mixing ratio (e.g., 0% of the I clock and 100% of the Q clock) to produce an injection signal that is in-phase with the Q clock, which as noted above, is in quadrature with the I clock. The phase interpolator mixer 302 also generates an injection signal 320 that is the inverse of the injection signal 318 and is thereby in-phase with the ~Q clock. The phase interpolator mixer 304 generates an injection signal 322 by mixing the clock signals according to a 50/50 mixing ratio (e.g., 50% of the I clock and 50% of the Q clock) to produce an injection signal that is phase offset with the Q clock by 45 degrees and thus phase offset with the I clock by 135 degrees. The phase interpolator mixer 304 also generates an injection signal 324 that is the inverse of the injection signal 322. As with the injection signal 124 and injection signal 128, the injection signal 318 and injection signal 322 have inverse step profiles.

As shown, the phase interpolator mixers 302 and 304 provide the injection signals at their respective outputs. The outputs of the phase interpolator mixers 302 and 304 are connected to injection points of the injection-locked ring 306. In particular, the outputs of interpolator mixer 302 are connected to the injection point of delay stage 116 and the outputs of phase interpolator mixer 304 are connected to the injection point of delay stage 118. Accordingly, the injection signal 318 and injection signal 320 are injected into the injection point of the delay stage 116, and the injection signal 322 and injection signal 324 are injected into the injection point of the delay stage 118. The injection-locked ring 306 generates output clock phases based on the injection signals provided by the phase interpolator mixers 104 to 304 in the same manner as described above with reference to FIG. 1.

Figure 4A:
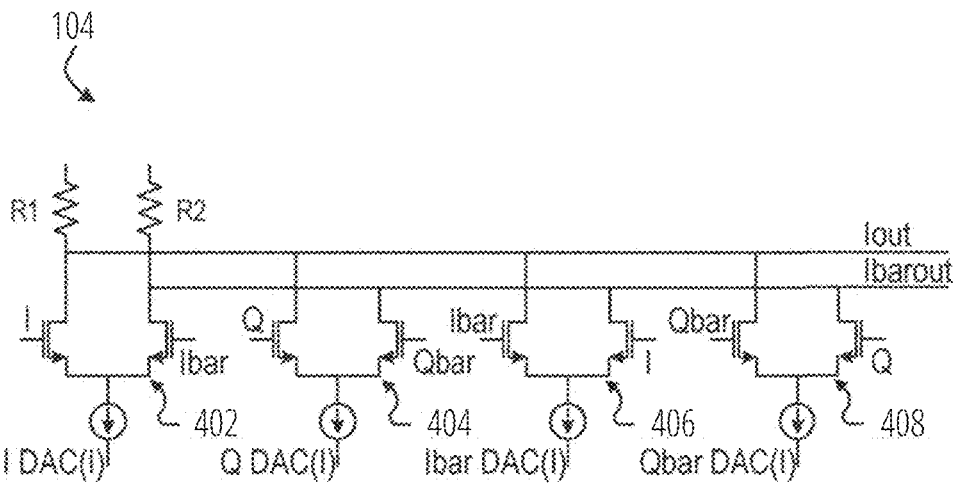
FIG. 4A and FIG. 4B are circuit diagrams illustrating phase interpolator mixers, which are provided as part of the hybrid phase interpolator, according to some examples.

FIG. 4A is a circuit diagram illustrating the phase interpolator mixer 104 included in the hybrid phase interpolator 100. As illustrated in FIG. 4A, the phase interpolator mixer 104 includes differential amplifier 402 to 408 and load resistors R1 and R2. Differential amplifier 402 includes first and second n-channel metal-oxide-semiconductor (NMOS) transistors. As shown, the source nodes of the first and second NMOS transistors are connected to a digital-to-analog controller (DAC) for the I clock. Further, the drain nodes of the first and second NMOS transistors are connected to the resistors R1 and R2. In addition, the first NMOS transistor (e.g., left transistor) receives the I clock at its gate node and the second NMOS transistor (e.g., right transistor) receives an ~I clock at its gate node. In an embodiment, resistors R1 and R2 are of equal resistance.

In some embodiments, differential amplifiers 404 to 408 are similar in structure to differential amplifier 402. However, as illustrated in FIG. 4A, (i) the first and second NMOS transistors receive different clocks at their respective gate nodes and (ii) the source nodes of the respective first and second NMOS transistors are connected to different DACs. For example, with regard to the differential amplifier 404, (i) the source nodes of the first and second NMOS transistors are connected to a DAC associated with the Q clock and (ii) the first NMOS transistor receives a Q clock at its gate node and the second NMOS transistor receives a ~Q clock at its gate node. Further, with regard to the differential amplifier 406, (i) the source nodes of the first and second NMOS transistors are connected to a DAC associated with the ~I clock and (ii) the first NMOS transistor receives an ~I clock at its gate node and the second NMOS transistor receives an I clock at its gate node. Lastly, with regard to the differential amplifier 408, (i) the source nodes of the first and second NMOS transistors are connected to a DAC associated with the ~Q clock and (ii) the first NMOS transistor receives a ~Q clock at its gate node and the second NMOS transistor receives a Q clock at its gate node.

The drain node of the first NMOS transistor of the differential amplifier 402 is connected to the drain node of the first NMOS transistor of each of the differential amplifiers 404 to 408. Similarly, the drain node of the second NMOS transistor of the differential amplifier 402 is connected to the drain node of the second NMOS transistor of each of differential amplifier 404 to 408.

Output injection signals (e.g., the injection signal 124 and an inverse of the injection signal 124) are interpolated between the clocks received at the first and second NMOS transistors of each of the differential amplifiers 402 to 408. Specifically, the interpolator mixer 104 generates the injection signals based on the currents at the I, ~I, Q, and ~Q DACs. Accordingly, the output injection signals can be positioned anywhere within a 1-clock-period interval (which may correspond to 2 data bits in a half-rate system, or 4 data bits in a quarter-rate system).

Further, only two adjacent differential amplifiers are ever on at once: (i) differential amplifier 402 and 404 or (ii) differential amplifier 404 and 406 or (iii) differential amplifiers 406 and 408 or (iv) differential amplifier 408 and 402. Therefore, because the input clocks between differential amplifiers are in quadrature, the output injection signals will also be in quadrature. For example, if the I DAC current (i.e., differential amplifier 402) is nonzero but the Q DAC current (i.e., differential amplifier 404) is zero, then the injection signal 124 will be aligned with the I input clock. Similarly, if the I DAC current is zero but the Q DAC current is nonzero, then the injection signal 124 will be aligned with the Q input clock. However, if (i) the I DAC current is equal to the Q DAC current, then the injection signal 124 will be phase-aligned half-way between the I and Q input clocks. In other words, as the 1 DAC current is gradually decreased and the Q DAC current is gradually increased, that phase of the injection signal moves from being aligned with the I input clock towards being aligned with the Q input clock. In this manner, the phase interpolator mixer 104 generates a new "interpolated" output clock as the injection signal 124. Further, as mentioned previously above, the inverse of the injection signal 124 will include the same phase as the injection signal 124 but will be of opposite polarity.

Figure 4B:
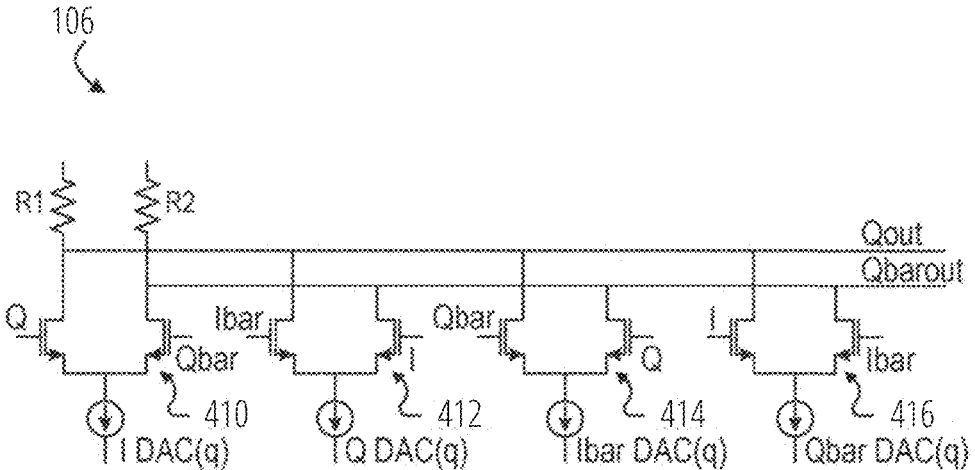

FIG. 4B is a circuit diagram illustrating the phase interpolator mixer 106 included in the hybrid phase interpolator 100. The phase interpolator mixer 106 is similar in structure to the phase interpolator mixer 104 except that the differential amplifiers 410 to 416 receive different input clocks than the differential amplifiers 402 to 408. For example, with regard to the differential amplifier 410, the first NMOS transistor receives a Q clock at its gate node and the second NMOS transistor receives a ~Q clock at its gate node. Further, with regard to the differential amplifier 412, the first NMOS transistor receives an ~I clock at its gate node and the second NMOS transistor receives an I clock at its gate node. Further, with regard to the differential amplifier 414, the first NMOS transistor receives a ~Q clock at its gate node and the second NMOS transistor receives a Q clock at its gate node. Lastly, with regard to the differential amplifier 416, the first NMOS transistor receives an I clock at its gate node and the second NMOS transistor receives an ~I clock at its gate node.

Figure 5:
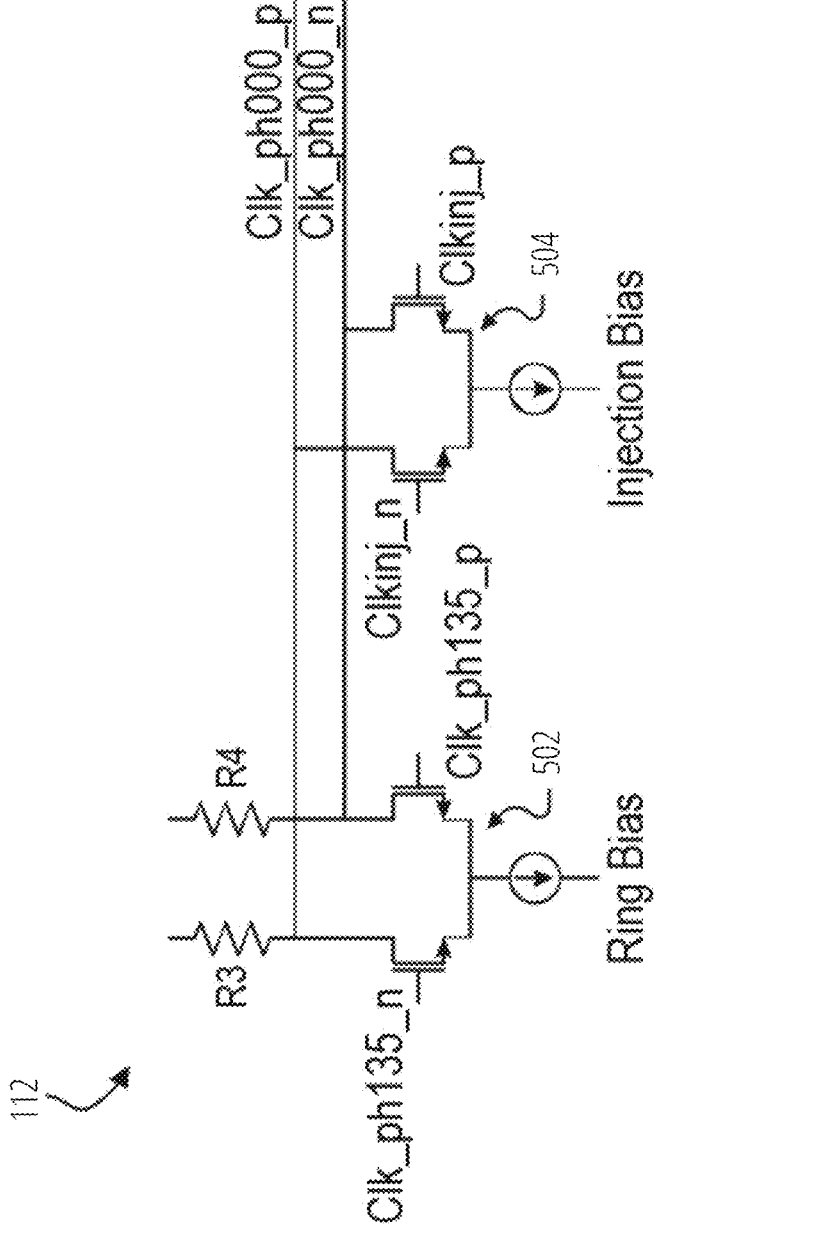
FIG. 5 is a circuit diagram illustrating a delay stage of an injection-lock ring, which is provided as part of the hybrid phase interpolator, according to some examples.

FIG. 5 is a circuit diagram illustrating a delay stage of the injection-locked ring 108, which is provided as part of the hybrid phase interpolator 100. Specifically, FIG. 5 depicts the first delay stage 112. The first delay stage 112 includes differential amplifiers 502 and 504 and load resistors R3 and R4. In some embodiments, resistors R3 and R4 are of equal resistance. In an embodiment, differential amplifier 502 includes first and second NMOS transistors.

As further illustrated in FIG. 5, the source nodes of the first and second NMOS transistors are connected to a bias current for the injection-locked ring 108. Further, the drain nodes of the first and second NMOS transistors are connected to the resistors R3 and R4. In addition, the first NMOS transistor (e.g., left transistor) receives clock signal Clk_135_*n* at its gate node and the second NMOS transistor (e.g., right transistor) receives clock signal Clk_135_*p* at its gate node. In an embodiment, with regard to the differential amplifier 504, (i) the source nodes of the first and second NMOS transistors are connected to an injection bias current and (ii) the first NMOS transistor receives an inverse of the injection signal 124 (e.g., ˜I clock) at its gate node and the second NMOS transistor receives the injection signal 124 (e.g., I clock) at its gate node.

Further. (i) the drain node of the first NMOS transistor of the differential amplifier 502 is connected to the drain node of the first NMOS transistor of the differential amplifier 502 and (ii) the drain node of the second NMOS transistor of the differential amplifier 502 is connected to the drain node of the second NMOS transistor of the differential amplifier 504. In an embodiment, the first delay stage 112 is able to lock the clock signals Clk_0_*p* and Clk_0_*n* to the injection signals (i.e., the injection signal 124 and the inverse of the injection signal 124) based on the ring and injection bias currents.

The ring oscillator's bias current is typically calibrated along with the value of the load resistors (i.e., R3 and R4) through a digital calibration loop at startup, so as to force the ring oscillator to have a natural oscillation frequency which is as close to the injection frequency as possible. This places the ring oscillator, when injection-locked, within the center of its lock range. If the injection signal frequency is increased (or decreased) beyond a certain value, above or below this calibrated natural ring oscillation frequency, then the loop will lose lock since the ring oscillator is trying to naturally oscillate at a point which is too far away from the driving injection frequency. The ring's natural oscillation frequency depends on the load resistance and capacitance at the output of each delay stage.

Further, the ring oscillator's voltage swing and loop gain depends partly on the bias current and load resistor values. The injection bias current is typically some fraction of the calibrated ring oscillator bias, having sufficient strength to allow the injection differential pair (e.g., 500) to "pull" the ring oscillator stage into phase alignment with the injection signals (i.e., the injection signal 124 and the inverse of the injection signal 124). The injection bias must be strong enough to allow the injection signal to lock the ring oscillator (stronger injection biases help maximize the lock range). For example, the ring bias may range anywhere from several hundred microamps (e.g., for a 500 MHz natural frequency) to several milliamps (e.g., for a 5 GHz to 10 GHz natural frequency). Further, a typical value for the injection bias would be one-quarter of the respective ring bias. Consistent with some embodiments, the other delay stages 114 to 118 include circuit structures essentially identical to the delay stage 112. However, the other delay stages do not receive the same injection signals as the delay stage 112. For example, as noted above, the delay stage 114 receives the injection signal 126.

Figure 6:
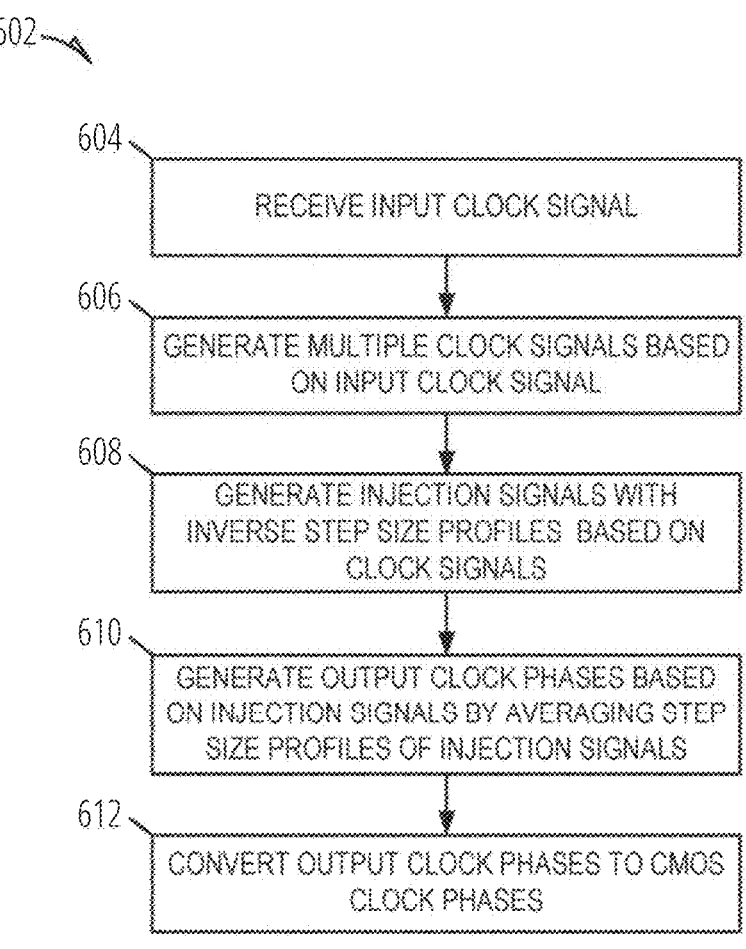
FIG. 6 is a flow diagram illustrating operations of the hybrid phase interpolator in performing a method for generating multiple clock phases using constant step sizes, according to some examples.

FIG. 6 is a flow diagram illustrating operations of the hybrid phase interpolator 100 in performing a method 602 for generating multiple clock phases using constant step sizes. At operation 604, the clock divider 102 receives an input clock signal. The input clock signal may be generated by a clock generator.

At operation 606, the clock divider 102 generates at least two clock signals based on the input clock signal. For example, the clock divider may generate a first clock signal that is in-phase with the input clock signal (e.g., the I clock), and a second clock signal that is phase offset with the input clock signal by 90 degrees (e.g., the Q clock). In light of the phase shift, the first and second clock signal are in quadrature with one another. The clock divider may further generate a third clock signal that is an inverse of the first clock signal (e.g., the ˜I clock), and a fourth clock signal that is an inverse of the second clock signal (e.g., the ˜Q clock).

At operation 608, the phase interpolator mixers 104 to 304 generate injection signals based on the first and second clock signal generated by the clock divider 102. In generating the injection signals, the phase interpolator mixer 104 generates a first injection signal (e.g., injection signal 124) that is in-phase with the first clock signal. The phase interpolator mixer 104 generates the injection signal 124 by combining the first and second clock signal according to a first combination. For example, the phase interpolator mixer 104 may generate the injection signal 124 by combining the first and second clock signals at a 100/0 mixing ratio (e.g., 100% first clock signal and 0% second clock signal).

The phase interpolator mixer 106 generates a second injection signal (e.g., injection signal 128) that corresponds to a phase shift of the first clock signal (e.g., a 45-degree phase shift). The phase interpolator mixer 106 generates the second injection signal by combining the first and second clock signal according to a second combination. For example, the phase interpolator mixer 106 may generate the second injection signal 128 that corresponds to a 45-degree phase shift of the first clock signal by combining the first and second clock signals at a 50/50 mixing ratio (e.g., 50% first clock signal and 50% second clock signal). By generating the injection signals in this manner, the first injection signal 124 and injection signal 128 have a 45-degree phase difference.

In addition, by generating the first injection signal 124 and injection signal 128 in this manner, the first injection signal 124 and the second injection signal 128 have inverse step size profiles. As noted above, the step size profile describes a relationship between step size and phase position. Thus, the relationship between step size and phase position in the first injection signal is the inverse of the relationship between step size and phase position in the second injection signal.

Consistent with some embodiments, the phase interpolator mixer 104 may further generate a third injection signal (e.g., injection signal 126) that is an inverse of the first injection signal, and the phase interpolator mixer 106 may further generate a fourth injection signal (e.g., injection signal 130) that is an inverse of the second injection signal.

At operation 610, the injection-locked ring 108 generates output clock phases based on the injection signals. In generating the output clock phases, the injection-locked ring 108 averages the step size profiles of the injection signals. As noted above, the first and second injection signals have inverse step size profiles. Thus, by averaging the inverse step size profiles, the injection-locked ring 108 generates output clock phases using constant step sizes. The output clock phases may include at least a first and second output clock phase that are offset by 45 degrees. The output clock phases further include: a third output clock phase that is offset with first output clock phase by 90 degrees; a fourth output clock phase that is offset with the first output clock phase by 135 degrees; a fifth output clock phase that is offset with the first output clock phase by 180 degrees; a sixth output clock phase that is offset with the first output clock phase by 225 degrees; a seventh output clock phase that is offset with the first output clock phase by 270 degrees; and an eighth output clock phase that is offset with the first output clock phase by 315 degrees.

At operation 612, the output buffers 110 convert the output clock phases to complementary metal-oxide-semiconductor (CMOS) clock phases. In converting the output clock phases, the output buffers 110 may utilize blending techniques to reduce static and rotating skews in the CMOS clock phases.

FIG. 7 is a block diagram illustrating a blending hybrid phase interpolator 700 with blending buffers 706 and 708. The blending hybrid phase interpolator 700 is a further variant of the hybrid phase interpolator 300 of FIG. 3.

As in the hybrid phase interpolator 100 and hybrid phase interpolator 300, the blending hybrid phase interpolator 700 includes a clock divider 102 that receives an input clock signal. The clock divider 102 generates multiple clock signals including in-phase (I) and quadrature (Q) clock signals based on the input clock signal. In some examples, the clock divider 102 may further generate inverse I clock and inverse Q clock signals.

As in the hybrid phase interpolator 300, the blending hybrid phase interpolator 700 includes multiple phase interpolator mixers (104, 106, 302, 304) that receive the clock signals from the clock divider 102. Each phase interpolator mixer generates injection signals based on different combinations of the I and Q clocks. For example, the phase interpolator mixer 104 generates injection signals by mixing clock signals according to a 100/0 mixing ratio to produce an in-phase signal, while interpolator mixer 106 uses a 50/50 mixing ratio to produce a 45-degree phase shifted signal.

As in the hybrid phase interpolator 300, an injection-locked ring 108 receives the injection signals from the phase interpolator mixers. The injection-locked ring 108 comprises multiple delay stages (112, 114, 116, 118) that each contribute a finite delay. Each delay stage includes at least one injection point for receiving the injection signals. The injection-locked ring 108 generates output clock phases based on averaging the step size profiles of the injection signals.

A blender 704 processes the output clock phases from the injection-locked ring 108. The blender 704 includes blending buffers 706 and 708 that weight multiple input phases to create output phases. The blending buffers provide adjustable weighting that enables phase movement at the output. The blending buffers 706 and 708 generate four CMOS clock phases at their outputs.

In some examples, the blending buffers 706 and 708 may provide a blending range enabling the blender delay values to span at least 1.5 unit intervals of input data in a quarter rate system. The blending operation reduces static and rotating skews in the output clock phases.

Collectively, the components from the clock divider 102 through the injection-locked ring 108 are referred to herein as the PI 702 or PI block. The blending buffer 706 and blending buffer 708 are referred to as the blender 704 or blender block.

FIG. 8A and FIG. 8B are circuit diagrams illustrating circuit implementations of I-mixer 802 and I45-mixer 826 configurations of a hybrid phase interpolator, such as hybrid phase interpolator 100, hybrid phase interpolator 300, or blending hybrid phase interpolator 700. The I-mixer 802 is an example implementation of the "I" interpolator mixer 104 and provides an example of a primary mixer, and the I45-mixer 826 is an example implementation of the "I45" interpolator mixer 106 and provides an example of a secondary mixer. In the examples described herein, the primary mixers are the I-mixer 802 and a Q-mixer (such as interpolator mixer 302 of FIG. 3 or FIG. 7), and the secondary mixers are the I45-mixer 826 and a Q45-mixer (such as interpolator mixer 304 of FIG. 3 or FIG. 7).

The I-mixer 802 includes four differential pairs 812 of transistors providing the four input clock signals: an I input clock signal 804, a Q input clock signal 806, an I-bar input clock signal 808, a Q-bar input clock signal 810. Two tunable resistors 822 are connected between a supply voltage Vdd and the differential pairs 812. Each differential pair 812 has a respective switch 824 connecting it to a current source 836 above ground 838. (While not shown, the Q mixer (e.g., interpolator mixer 302) has Q, Ib, Qb, and I as inputs, with the same encoding as the I-mixer 802.)

Each differential pair 812 receives one of the input clock signals (I, Q, I-bar, Q-bar) at its gate terminals. The I-bar clock is another term for the ~I clock, and the Q-bar clock is another term for the ~Q clock, described above.

In the illustrated example, the I-mixer 802 and I45-mixer 826 are controlled by a conventional thermometer code, as described below with reference to FIG. 9A-FIG. 9B. The switches 824 are controlled by different subsets of the 512 thermometer bits of the phase interpolator (PI) code: a first subset of PI code bits 814 consisting of bits <127:0>, a second subset of PI code bits 816 consisting of bits <255:128>, a third subset of PI code bits 818 consisting of bits <383:256>, and a fourth subset of PI code bits 820 consisting of bits <511:384>. Thus, each switch 824 is capable of being controlled to weight its associated input clock signal with a weight having a resolution of 128 steps. The phases of the input clock signals can be mixed together by each of the mixers based on a weighted average of their associated weights, thereby generating an output clock signal with an interpolated phase between the phases of the two input clock signals.

The I45-mixer 826 employs a similar circuit structure to the I-mixer 802, but with reconfigured code bit assignments. It receives the same input clock signals at its differential pairs 812, and has the same arrangement of tunable resistors 822, switches 824, current source 836, and ground 838. (While not shown, the 135 mixer (e.g., interpolator mixer 304) has Q, Ib, Qb, and I as inputs, with the same encoding as the I45-mixer 826.)

However, the switches 824 of the I45-mixer 826 are controlled by different subsets of phase interpolator code bits. The subsets used by the I-mixer 802 are redistributed or recombined into different subsets: a first recombined subset of PI code bits 828 consisting of bits <511:448> and <63:0>, a second recombined subset of PI code bits 830 consisting of bits <127:64> and <191:128>, a third recombined subset of PI code bits 832 consisting of bits <255:192> and <319:256>, and a fourth recombined subset of PI code bits 834 consisting of bits <383:320> and <447:384>. It will be appreciated that each of the recombined subsets includes 128 bits: 64 bits from one of the subsets used by the I-mixer 802 (e.g., first recombined subset of PI code bits 828 includes bits <0:63> from the first subset of PI code bits 814), and 64 bits from another one of the subsets used by the I-mixer 802 (e.g., first recombined subset of PI code bits 828 includes bits <511:448> from the fourth subset of PI code bits 820). The code bit redistribution between the I-mixer 802 and I45-mixer 826 configurations enables generation of phases offset by 45 degrees. By using 45 degree phase shifted clocks instead of 90 degree phase shifted clocks, the INL profiles are inverted and thus cancelled in the ILL ring stage, resulting in very low INL for the output clock. The rotating clock skew from the mixers can also be corrected more effectively with 45 degree clocks compared to 90 degree clocks in some examples. In addition, the injection energy with 4 mixer stages may be higher, and the lock range of the ILL loop can be higher, e.g., by approximately 50%.

In some examples, the tunable resistor 822 in both mixers (I-mixer 802 and I45-mixer 826) may be adjusted based on operating frequency to maintain proper common mode voltage while enabling power scaling. At lower frequencies, current may be reduced and resistance increased to maintain voltage levels while reducing power consumption.

The differential pairs 812 implement current-mode logic (CML) mixing of the input clock signals. The mixing ratios are controlled by the thermometer-coded phase interpolator bits to generate output phases. In some examples, the mixing may employ 128 thermometer-coded units per quadrant to provide fine phase resolution.

In some examples, the switches 824 may be implemented as current steering switches that direct current through selected differential pairs based on the active thermometer code bits.

FIG. 9A and FIG. 9B illustrate mixer encoding tables for I/Q primary mixers and I45/Q45 secondary mixers using a conventional thermometer encoding. The primary mixer thermometer encoding 900 shows a configuration for the I-mixer 802, and the secondary mixer thermometer encoding 902 shows a configuration for the I45-mixer 826. These same control bit configurations can be used with a different ordering of input clocks for the Q-mixer and the Q45-mixer, as described below.

The primary mixer thermometer encoding 900 and secondary mixer thermometer encoding 902 are shown as 512 rows in a pair of tables (elided by ellipses, " . . . ", for visibility). Each row corresponding to a phase code 904 value ranging from 0 to 511, controlling the phase interpolation across a full 360-degree range. Each value of the phase code 904 corresponds to a unique binary string of the 512 bits of the code. However, because the bits are all thermometer bits, the 512 bits only encode 512 unique values of the phase code 904. Each phase code 904 value provides a different first subset of PI code bits to control each of the four mixers.

For the I/Q mixer configuration, the primary mixer thermometer encoding 900 shows control bit configurations for the I-mixer 802. The primary mixer thermometer encoding 900 includes an I clock weight 906 controlled by bits <127:0>, a Q clock weight 908 controlled by bits <255:128>, an I-bar clock weight 910 controlled by bits <383:256>, and a Q-bar clock weight 912 controlled by bits <511:384>. At phase code 0, the I clock weight 906 is set to 128 while other weights are 0, thereby generating a first output clock signal having the same phase as the I input clock signal 804 due to the 100/0 mixing ratio between I and Q.

The primary mixer thermometer encoding 900 shown in FIG. 9A can therefore be understood to represent the configuration of the I-mixer 802, using input clocks ordered as I, Q, Ib, Qb. In contrast, the Q-mixer (e.g., interpolator mixer 302 of FIG. 3, not shown) shifts the incoming clocks to Q, Ib, Qb, I, and the phase controls remain the same. For the Q-mixer, the Q clock weight 908 and I-bar clock weight 910 provide relative weights of 100/0 for the Q clock input (Q clock weight 908)/I-bar clock input (I-bar clock weight 910), yielding the Q clock at the output, which is shifted by 90 degrees from the I clock output generated by the I-mixer 802. It will be appreciated that, in the Q-mixer, the Q clock weight 908 is generated based on control bits <0:127>, and the I-bar clock weight 910 based on control bits <255:128>.

Returning to the illustrated primary mixer thermometer encoding 900 of the I-mixer 802: as the phase code 904 increases, the I clock weight 906 decreases while the Q clock weight 908 increases, creating intermediate phases between I and Q. At phase code 64, both I and Q weights equal 64, producing a 45-degree phase shifted clock due to the 50/50 mixing ratio between I and Q.

In FIG. 9B, the secondary mixer thermometer encoding 902 shows control bit configurations for the I45-mixer 826. The secondary mixer thermometer encoding 902 implements a 45-degree offset from the primary mixer through shifted bit assignments. In the secondary mixer thermometer encoding 902, the I clock weight 906 is controlled by bits <448:511> and <0:63>, the Q clock weight 908 is controlled by bits <64:191>, the I-bar clock weight 910 is controlled by bits <192:319>, and the Q-bar clock weight 912 is controlled by bits <320:447>. This half-and-half redistribution or recombination of the subsets of bits used to control the switches 824 of the I-mixer 802 maintains a constant 45-degree phase offset between the primary mixer and the secondary mixer output clock signals across all phase codes.

As with the primary mixer thermometer encoding 900, the secondary mixer thermometer encoding 902 shown in FIG. 9B can be understood to represent the configuration of the I45-mixer 826. In contrast, the Q45-mixer (e.g., interpolator mixer 304 of FIG. 3, not shown) changes the incoming clocks from (I, Q, I-bar, Q-bar) to (Q, I-bar, Q-bar, I), and the phase controls remain the same. Thus, in the Q45-mixer, the control bits of the Q clock weight 908 and I-bar clock weight 910 provide relative weights of 50/50 for the Q clock input (Q clock weight 908)/I-bar clock input (I-bar clock weight 910), yielding the Q-45 clock at the output, which is shifted by 90 degrees from the I-45 clock output generated by the I45-mixer. It will be appreciated that, in the Q-mixer, the Q clock weight 908 is generated based on control bits <448:511> and <0:63>, and the I-bar clock weight 910 based on control bits <64:191>.

The encoding scheme shown in FIG. 9A and FIG. 9B employs pure thermometer coding, where each bit represents an equal current weight in the mixer. For example, when transitioning from phase code 0 to 1, exactly one thermometer bit changes state. This approach minimizes glitches and non-monotonic steps, but it requires routing many control signals, for example, routing 512 bits along the CDR-PI digital-analog interface. There may also be a target thermometer-bus skew for optimal INL performance of the phase interpolator, especially in systems using Spread Spectrum Clocking (SSC), in which the transmitter and receiver have 100 MHz reference clocks slightly offset to reduce Electro-Magnetic-Interference (EMI). Meeting the stringent skew targets and closing the digital block timing for the CDR-PI path can require an exponentially larger amount of power and area overhead. Thus, there is a need for more efficient encoding while attaining higher PI resolution.

In high-speed systems, more efficient use of control signal bit encoding may be required: the mixed thermometer-binary and thermometer-binary-boundary encoding schemes described below with reference to FIG. 10A-FIG. 10B and FIG. 11A-FIG. 11C can potentially address this limitation of pure thermometer encodings.

Furthermore, in a mixed thermometer-binary approach, the more binary bits that are used, the higher the likelihood of glitches and non-monotonic steps which could be detrimental to the PI's INL performance. Hence, there is a trade-off between routing complexity area and power, on the one hand, and INL performance on the other hand. As a result, in some examples, only one or a small number of binary bits can be used, with the remaining bits all being thermometer bits. The phase interpolation process continues through all 512 phase codes, with weights shifting between I, Q, I-bar and Q-bar in sequence to cover the full 360-degree range. The thermometer encoding ensures that the phase steps remain uniform and that random mismatch variations in integral non-linearity (INL) are minimized across the interpolation range.

The encoding tables demonstrate how the mixer weights transition smoothly between quadrants while maintaining proper phase relationships. For instance, as the I weight decreases to 0, the Q weight reaches maximum, followed by I-bar weight increasing-creating a continuous phase rotation. It will be appreciated that this phase rotation can happen in both directions, either by incrementing or decrementing the phase code, usually varying from step size 1 to 12. The phase step size may be dependent on factors such as CDR gain and bandwidth settings.

FIG. 10A and FIG. 10B illustrate mixer encoding tables showing a primary mixer thermometer-binary encoding 1000 and secondary mixer thermometer-binary encoding 1002.

The table in FIG. 10A shows a primary mixer thermometer-binary encoding 1000. As in the primary mixer thermometer encoding 900 of FIG. 9A, the primary mixer thermometer-binary encoding 1000 table has 512 rows (elided and foreshortened for visibility), each row corresponding to a unique value of a phase code 1004. Each value of the phase code 1004 corresponds to a binary sequence split into four quadrants associated with the four input clock signals. Each quadrant generates a weight for its associate input clock signal based on 63 most-significant-bit (MSB) thermometer bits 1006, one least-significant-bit (LSB) thermometer bits 1008, and one LSB binary bits 1010, shown in the table arranged in columns for each mixer stage. Thus, the I clock weight 1012 is generated based on the 63 MSB thermometer bits 1006 <62:0>, the LSB thermometer bit 1008, and the LSB binary bit 1010 shown in the first three columns. The Q clock weight 1014 is generated based on the 63 MSB thermometer bits 1006 <125:63>, the LSB thermometer bit 1008, and the LSB binary bit 1010 shown in the next three columns. The I-bar clock weight 1016 is generated based on the 63 MSB thermometer bits 1006 <188:126>, the LSB thermometer bit 1008, and the LSB binary bit 1010 shown in the next three columns. And the Q-bar clock weight 1018 is generated based on the 63 MSB thermometer bits 1006 <251:189>, the LSB thermometer bit 1008, and the LSB binary bit 1010 shown in the last three columns.

Whereas the 63 MSB thermometer bits 1006 increment the associated weight by a full step apiece (corresponding to 63 full steps of magnitude of the weight), the LSB thermometer bit 1008 and LSB binary bit 1010 each provide an additional, finer-resolution half-step increment of magnitude. Thus, when the phase code 1004 changes only by the toggling of the value of one of the LSB bits (e.g., from 01 to 1 or 1 to 0), the magnitude of the associated weight changes by half the amount that the weight changes when the MSB bits are incremented or decremented. The use of half-steps between each of 63 full steps, and an extra 2 half-steps (e.g., from code 126 to code 129), results in 128-increment resolution equal to the resolution of the pure thermometer code of FIG. 9A and FIG. 9B but using far fewer bits to encode the phase code 1004 than phase code 904. This more efficient encoding may enable phase interpolation at faster data rates, as described above.

As in FIG. 9A, the illustrated I/Q mixer encoding of the primary mixer thermometer-binary encoding 1000 corresponds to the control scheme of the I-mixer 802. The Q-mixer (e.g., interpolator mixer 302) uses a control scheme in which the incoming clocks are shifted to Q, Ib, Qb, I, and the phase controls remain the same.

The secondary mixer thermometer-binary encoding 1002 used by the secondary mixers implements a similar structure to the primary mixer thermometer-binary encoding 1000, but with redistributed or recombined MSB bit ranges of 63 bits to maintain a 45-degree offset. The I clock weight 1012 uses MSB bits <220:251> and <0:30>, the Q clock weight 1014 uses MSB bits <31:62> and <63:93>, the I-bar clock weight 1016 uses MSB bits <94:125> and <126:156>, and the Q-bar clock weight 1018 uses MSB bits <157:188> and <189:219>. Each weight generated by the secondary mixer thermometer-binary encoding 1002 also has its own LSB thermometer bit and LSB binary bit values, as shown. The Q45-mixer (encoding not shown) changes the incoming clocks from (I, Q, I-bar, Q-bar) to (Q, I-bar, Q-bar, I), and the phase controls remain the same.

It will be appreciated that each 63-bit recombined subset of MSB bits used by each stage of the secondary mixer thermometer-binary encoding 1002 includes 32 bits from one of the subsets used by the primary mixer thermometer-binary encoding 1000 and 31 bits from another one of the subsets used by the primary mixer thermometer-binary encoding 1000.

The encoding scheme therefore employs a set of 252 MSB thermometer bits that only change in value twice over a 360-degree span (e.g., changing from 1 to 0 at a first point, such as code 0, and changing from 0 to 1 at a second point in the code sequence, such as 180 degrees from the first point), a set of eight LSB thermometer bits (four for the primary mixer thermometer-binary encoding 1000 and four for the secondary mixer thermometer-binary encoding 1002) that also only change in value twice over a 360-degree span, and a set of eight LSB binary bits (four for the primary mixer thermometer-binary encoding 1000 and four for the secondary mixer thermometer-binary encoding 1002) that may change in value more than twice over a 360-degree span, either regularly (e.g., alternating between 0 and 1) or irregularly. This mixed approach reduces the number of control signals (specifically, the number of bits in the phase code 1004 used to control the phase interpolator) compared to pure thermometer encoding, while potentially maintaining phase accuracy.

The phase interpolation process enabled by the phase codes shown in FIG. 10A-FIG. 10B progresses through all phase codes, with weights shifting between mixers in sequence. For example, at code 0, the I mixer outputs the I-clock (63I+0.5I+0.5I=64I), and the I-45 mixer outputs a 45° phase shifted clock (31I+0.5I+0.5I+32Q=32I+32Q). When the phase code 1004 value increments from 63 to 64, the I-mixer 802 decrements the I clock weight 1012 to 31 MSB bits while incrementing the Q clock weight 1014 to 32 bits, while reducing the magnitude of this change in weights by modulating values of the LSB bits to add or subtract half-steps. The LSB bits thereby provide fine resolution between the MSB steps. Thus, the mixed thermometer-binary approach can enable efficient phase control while reducing routing complexity compared to conventional thermometer-only implementations.

However, the mixed thermometer-binary encoding scheme shown in FIG. 10A-FIG. 10B can create an unintended phase offset issue at quadrant boundaries due to MSB bus asymmetry between the primary mixers (I/Q) and the secondary mixers (I45/Q45). At boundary transitions, such as between phase codes 63 and 64, the secondary mixers experience a positive phase jump of 2 LSB steps: for example, when incrementing the phase code 1004 from 63 to 64, the I45-mixer 826, controlled by the secondary mixer thermometer-binary encoding 1002 as shown in FIG. 10B, jumps from weights of 0.5I+63.5Q (e.g., a half-step weight for the I clock weight 1012 and 63 steps plus one half step for the Q clock weight 1014) to 63Q+1Ib (e.g., 63 steps for the Q clock weight 1014 and a full step for the I-bar clock weight 1016) instead of smoothly transitioning to 64Q. Similarly, at the two transitions from phase code 1004 values 127 to 128 and 128 to 129, the secondary mixers have a negative phase jump of 2 half-steps that corrects the previous offset. These discontinuous jumps at octant boundaries can create undesirable clock skew.

This limitation of the mixed thermometer-binary encoding shown in FIG. 10A-FIG. 10B can potentially be addressed by introducing 8 quadrant boundary phase shift bits (shown as B0-B7 in FIG. 11B and FIG. 11C below). These boundary bits can be added to the encodings used to control the secondary mixers while reusing the existing primary mixer phase code bits.

These boundary bits can provide smooth transitions at quadrant boundaries by maintaining the same codes between the primary mixers and secondary mixers during boundary crossings. The boundary bits only change in value twice over the 360-degree span, preventing any phase offset or skew from being introduced. In some examples, this approach can be used to maintain proper phase relationships while still achieving the area efficiency benefits of the mixed thermometer-binary encoding.

Figure 11A:
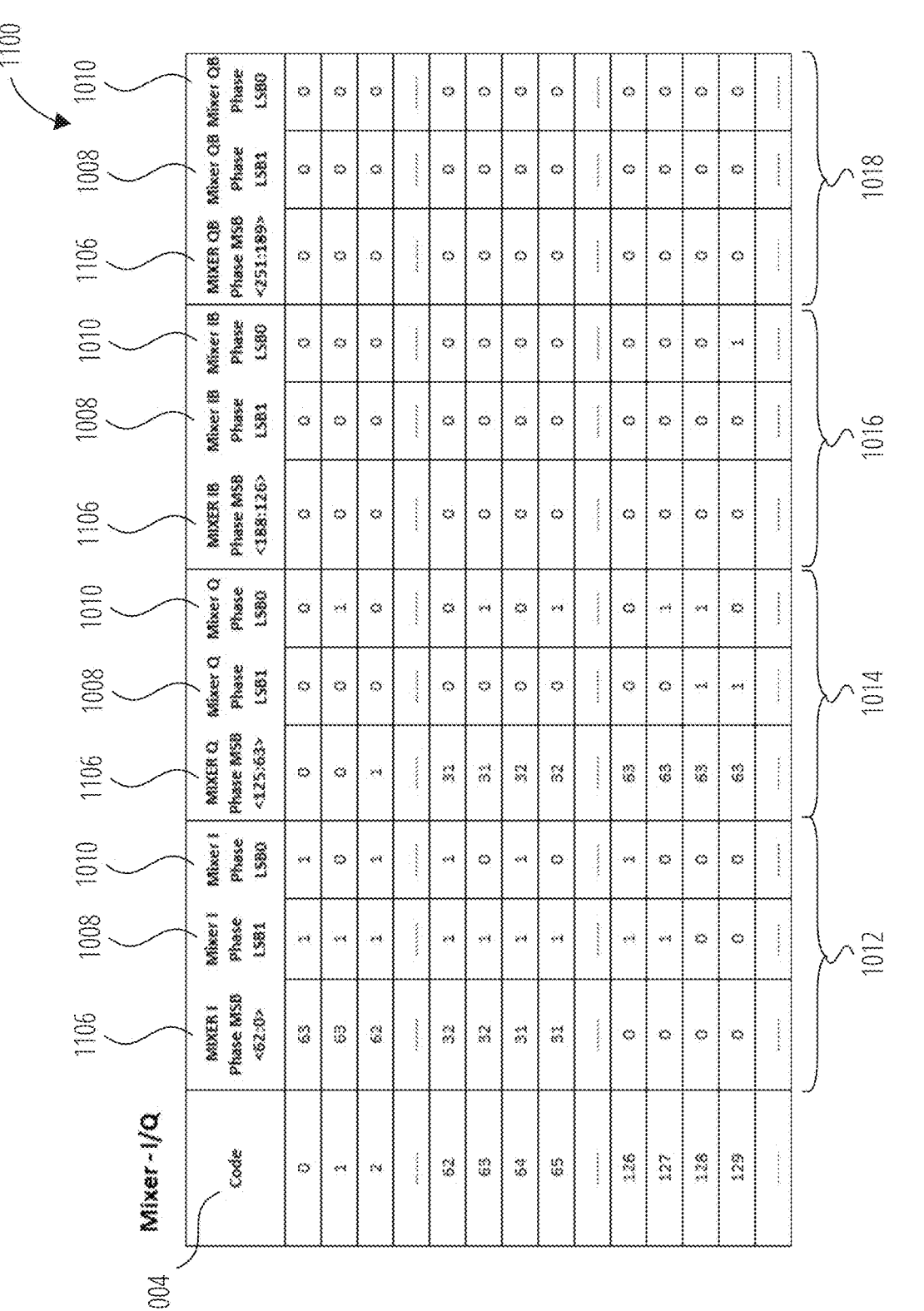
FIG. 11A, FIG. 11B, and FIG. 11C illustrate mixer encoding tables using mixed thermometer-binary-boundary encoding, according to some examples.
Figure 11B:
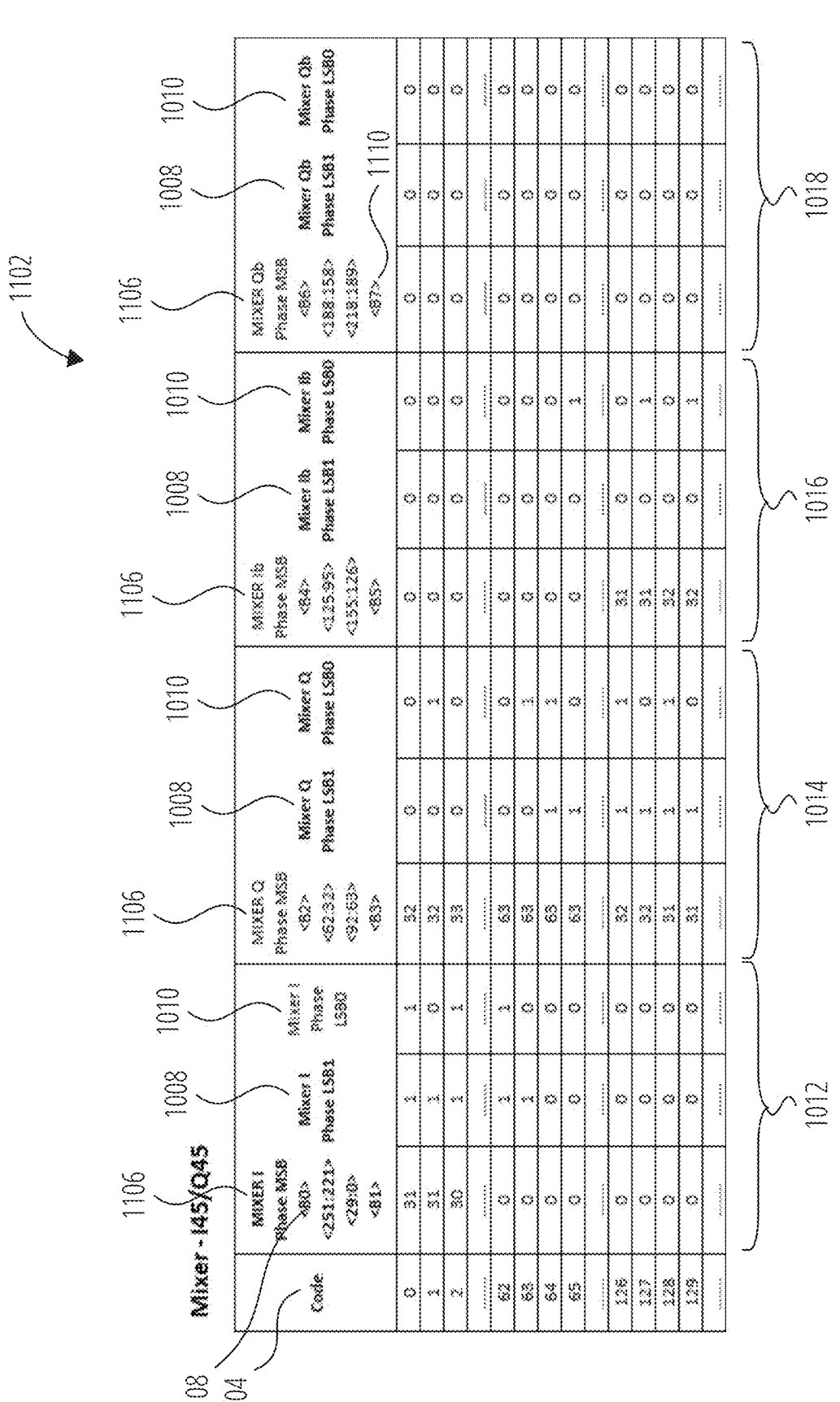
Figure 11C:
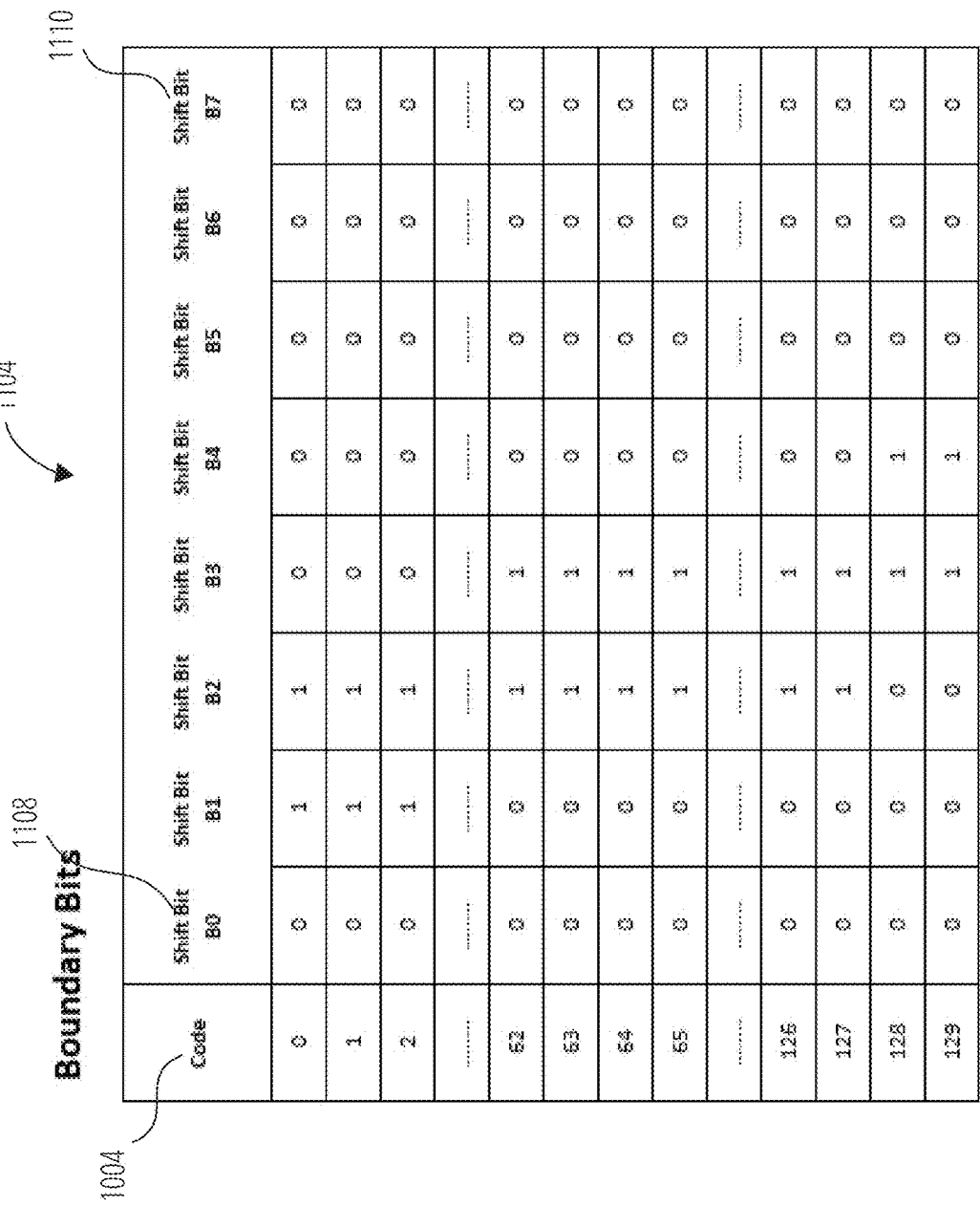

FIG. 11A, FIG. 11B, and FIG. 11C illustrate mixer encoding tables using a mixed thermometer-binary-boundary encoding. The mixed thermometer-binary-boundary encoding shown in these tables is an example of an encoding scheme for generating a mixed thermometer-binary phase interpolator code that can be used to control a phase interpolator to address one or more of the limitations of the encoding schemes shown in FIG. 9A-FIG. 9B and FIG. 10A-FIG. 10B.

In FIG. 11A, the primary mixer thermometer-binary-boundary encoding 1100 has columns showing the phase code 1004 and four sets of columns corresponding to the four weights generated and applied by a primary mixer (in this example, the I-mixer 802): I clock weight 1012, Q clock weight 1014, I-bar clock weight 1016, and Q-bar clock weight 1018. Each weight is generated by three columns of bits: MSB thermometer bits 1106, LSB thermometer bits 1008, and LSB binary bits 1010. It will be appreciated that the values of the LSB thermometer bit 1008 and LSB binary bit 1010 in the table rows are the same as those of the primary mixer thermometer-binary encoding 1000 of FIG. 10A.

As in the cases of the primary mixer thermometer encoding 900 and primary mixer thermometer-binary encoding 1000, the primary mixer thermometer-binary-boundary encoding 1100 shows the values used for the I-mixer 802; the values used for the Q-mixer (e.g., interpolator mixer 302, encoding not shown) shifts the incoming clocks to Q, Ib, Qb, I, and the phase controls remain the same.

In FIG. 11B, the secondary mixer thermometer-binary-boundary encoding 1102 is shown with the same columns as the primary mixer thermometer-binary-boundary encoding 1100: the phase code 1004 and four sets of columns corresponding to the four weights generated and applied by a secondary mixer (in this example, the I45-mixer 826): I clock weight 1012, Q clock weight 1014, I-bar clock weight 1016, and Q-bar clock weight 1018. Each weight is generated by three columns of bits: MSB thermometer bits 1106, LSB thermometer bits 1008, and LSB binary bits 1010. It will be appreciated that the values of the LSB thermometer bit 1008 and LSB binary bit 1010 in the table rows are the same as those of the secondary mixer thermometer-binary encoding 1002 of FIG. 10B. The Q45-mixer (encoding not shown) changes the incoming clocks from (I, Q, I-bar, Q-bar) to (Q, I-bar, Q-bar, I), and the phase controls remain the same.

The MSB thermometer bits 1106 used by the secondary mixer thermometer-binary-boundary encoding 1102 differ from those used by the corresponding secondary mixer thermometer-binary encoding 1002 shown in FIG. 10B. Instead of simply concatenating or combining portions of two subsets of MSB thermometer bits used by the primary mixer, the secondary mixer thermometer-binary-boundary encoding 1102 uses these portions of the existing subsets of MSB thermometer bits in combination with a pair of boundary bits, further described below with reference to FIG. 11C. Thus, the MSB thermometer bits 1106 used to generate the I clock weight 1012 are a first boundary bit B0 1108, existing MSB thermometer bits <251:221> and <29:0>, and a second boundary bit B1. Similarly, the MSB thermometer bits 1106 used to generate the Q clock weight 1014 are a boundary bit B2, existing MSB thermometer bits <62:32> and <92:63>, and a boundary bit B3; the MSB thermometer bits 1106 used to generate the I-bar clock weight 1016 are a boundary bit B4, existing MSB thermometer bits <125:95> and <155:126>, and a boundary bit B5; and the MSB thermometer bits 1106 used to generate the Q-bar clock weight 1018 are a boundary bit B6, existing MSB thermometer bits <188:158> and <218:189>, and an eighth boundary bit B7 1110. Thus, the secondary mixer thermometer-binary encoding 1002 includes eight boundary bits (B0-B7) associated with the MSB thermometer bit columns to control quadrant transitions.

In FIG. 11C, the values of the boundary bits 1104 are shown in the rows corresponding to the phase code 1004 values. Although not shown in FIG. 11C, the values of the code 1004 extend through the entire range (e.g., to phase code 511), rotating the sequences of 1-values from B1 (starting at code 0) to B7 and back to B0, then to B1 again.

Thus, the eight boundary bits (boundary bit B0 1108 through boundary bit B7 1110) only change in value twice over the 360-degree span. Each quadrant boundary uses two bits to ensure smooth transitions. For example, at the phase code 1004 transition between values 127 and 128, boundary bits B2 and B4 change values (from 1 to 0 and 0 to 1 respectively) to maintain consistent codes between the primary mixers and the secondary mixers. Each problematic boundary between MSB thermometer bit values exhibited by the secondary mixer thermometer-binary encoding 1002 is addressed and smoothed out by the use of the boundary bits 1104.

As in the previous example encodings, the secondary mixer thermometer-binary-boundary encoding 1102 shows values used by the I45-mixer 826; the Q45-mixer (e.g., interpolator mixer 304) changes the incoming clocks from (I, Q, I-bar, Q-bar) to (Q, I-bar, Q-bar, I), and the phase controls remain the same.

The encoding scheme shown in FIG. 11A through FIG. 11C therefore employs 252 MSB thermometer bits, 8 LSB thermometer bits, and 8 boundary bits 1104 that each only change in value twice over a respective 360-degree span, as well as 8 LSB binary bits that change in value more than twice over a 360-degree span, for a total control signal bit length of 276 bits, which is still significantly shorter than the 512 bits of the thermometer encoding of FIG. 9A-FIG. 9B. The boundary bits prevent the 2-LSB half-step phase jumps that can occur in some other mixed thermometer-binary implementations. The use of 8 additional boundary bits adds a relatively small amount of overhead the PI encoding scheme while maintaining phase skew relationships across the full 360-degree range.

FIG. 12 is a flow diagram illustrating operations of a method 1200 for controlling a phase interpolator. Whereas the method 1200 is described with reference to the various circuits described herein, it will be appreciated that some examples may implement method 1200 using different configurations of circuits and sub-circuits.

Although the example method 1200 depicts a particular sequence of operations, the sequence may be altered without departing from the scope of the present disclosure. For example, some of the operations depicted may be performed in parallel or in a different sequence that does not materially affect the function of the method 1200. In other examples, different components of an example device or system that implements the method 1200 may perform functions at substantially the same time or in a specific sequence.

The method 1200 begins with receiving a mixed thermometer-binary phase interpolator code at operation 1202. In some examples, the code may be generated at an encoder during an encoding operation (not shown), and transmitted from the encoder to the phaser interpolator. In some examples, the code is received by a decoder of the phase interpolator. In some examples, the Clock and Data Recovery (CDR) circuit sends up/down or lag/lead signals to the PI decoder, indicating a number of phase steps to increment or decrement, which can vary in some examples from 1 to 12. The phase jump may also be dependent on CDR gain and bandwidth settings. In some examples, such as the mixed thermometer-binary phase interpolator code described above with reference to FIG. 11A-FIG. 11C, the code consists of 252 MSB thermometer bits, 8 LSB thermometer bits, 8 LSB binary bits, and 8 boundary bits that collectively control the phase interpolation across a 360-degree range. In some examples, the code can also include other bits used for purposes other than controlling the mixers of the phase interpolator; however, in some examples, the MSB thermometer bits, LSB thermometer bits, LSB binary bits, and boundary bits constitute the entirety of the code. In some examples, the number of each type of bit differs (e.g., more or fewer than 252 MSB thermometer bits), resulting in a different resolution for the phase interpolation process.

At operation 1204, the mixed thermometer-binary phase interpolator code is decoded to generate control signals for the primary and secondary mixers. In some examples, a decoder of the phase interpolator may be used to decode the code. The decoder, alone or in combination with the mixers, generates first and second weights for each mixer based on the decoded code values. In some examples, more than two weights may be generated to mix three or four of the input clock signals instead of a pair of input clock signals. However, in the examples described above, only two of the four input clock signals are mixed for a given code value, such that only non (non-zero) weights are generated. Zero-value weights have no effect on the operation of the phase interpolator to generate the output clock signals.

Operation 1206 involves each primary mixer (e.g., an I-mixer and a Q-mixer) interpolating between two input clock signals based on the decoded code. The primary mixers adjust phase values through a combination of MSB thermometer bits for coarse steps and LSB thermometer and binary bits for fine half-steps. The MSB thermometer bits and LSB thermometer bits only change in value twice while the LSB binary bits may change in value more than twice over a 360-degree span. These weights are applied to the input clock signals to control the interpolation. An example implementation of operation 1206 broken down into sub-operations is shown in FIG. 13 and described below.

At operation 1208, each secondary mixer (e.g., an I45-mixer and a Q45-mixer) similarly interpolates between two input clock signals based on the decoded code, but with additional boundary bit control. The secondary mixers maintain a 45-degree offset from the primary mixers through shifted bit assignments and boundary bits that prevent phase discontinuities at quadrant transitions, such as those described above with reference to FIG. 11B and FIG. 11C. The boundary bits only change in value twice over a 360-degree span to ensure smooth phase progression. These weights are applied to the input clock signals to control the interpolation. An example implementation of operation 1208 broken down into sub-operations is shown in FIG. 14 and described below.

In some examples, method 1200 enables efficient phase interpolation while reducing routing complexity compared to conventional thermometer-only implementations. The mixed encoding approach with boundary bits can help to maintain proper phase relationships and step sizes across the full interpolation range while minimizing the number of control signals required.

Thus, in some examples, the mixed thermometer-binary phase interpolator code consists of 252 MSB thermometer bits, 8 LSB thermometer bits, 8 LSB binary bits, and 8 boundary bits that collectively control the phase interpolation across a 360-degree range. In some examples, for each primary mixer at operation 1206, a first subset of 63 MSB thermometer bits controls the magnitude steps for one input clock signal while a second subset of 63 MSB thermometer bits controls the steps for the other input clock signal, and the LSB thermometer and binary bits provide additional fine half-step control. In some examples, for each secondary mixer, a first subset of 61 MSB thermometer bits, the LSB bits, and two boundary bits control the magnitude steps for one input clock signal while a second subset of 61 MSB thermometer bits, the LSB bits, and two boundary bits control the steps for the other input clock signal. For the secondary mixers, the first and second subsets of MSB thermometer bits can each consist of 30 bits from one primary mixer subset and 31 bits from another primary mixer subset.

FIG. 13 is a flow diagram illustrating an example implementation of operation 1206 of method 1200. Whereas the operation 1206 is described with reference to the various circuits described herein, it will be appreciated that some examples may implement method 1300 using different configurations of circuits and sub-circuits.

Although the example operation 1206 depicts a particular sequence of operations, the sequence may be altered without departing from the scope of the present disclosure. For example, some of the operations depicted may be performed in parallel or in a different sequence that does not materially affect the function of the operation 1206. In other examples, different components of an example device or system that implements the operation 1206 may perform functions at substantially the same time or in a specific sequence.

The sub-operations of operation 1206 begin at operation 1302 by weighting each of the two input clock signals (e.g., for a given code value, two input clock signals selected from the four input clock signals, such as the two inputs having non-zero weights as indicated in the table of FIG. 11A) by a number of magnitude steps based on a respective subset of MSB thermometer bits. In the example encoding described above, for each primary mixer, a first subset of 63 MSB thermometer bits controls the magnitude steps for one input clock signal while a second subset of 63 MSB thermometer bits controls the steps for the other input clock signal.

At operation 1304, each input clock signal is further weighted by a number of half-steps based on a respective LSB thermometer bit. The LSB thermometer bits only change in value twice over a 360-degree phase interpolation range, providing finer phase resolution between the MSB steps.

Operation 1306 applies additional weighting to each input clock signal using half-steps based on respective LSB binary bits. Unlike the thermometer bits, the LSB binary bits may change in value more than twice over the phase range while maintaining proper phase relationships.

At operation 1308, the primary mixer generates a first output clock signal with a phase that represents the weighted average of the two input clock signals. The weighting combines the MSB magnitude steps with the LSB half-steps to create precise phase interpolation between the two input clocks.

Operation 1310 generates a second output clock signal that is phase-offset by 180 degrees from the first output clock signal.

In some examples, additional output clocks can be generated (e.g., for a total of four output clocks such as I, I45, Q, Q45) by performing the operations above for additional mixers, as described in greater detail above.

FIG. 14 is a flow diagram illustrating an example implementation of operation 1208 of method 1200. Whereas the operation 1208 is described with reference to the various circuits described herein, it will be appreciated that some examples may implement method 1400 using different configurations of circuits and sub-circuits.

Although the example operation 1208 depicts a particular sequence of operations, the sequence may be altered without departing from the scope of the present disclosure. For example, some of the operations depicted may be performed in parallel or in a different sequence that does not materially affect the function of the operation 1208. In other examples, different components of an example device or system that implements the operation 1208 may perform functions at substantially the same time or in a specific sequence.

The sub-operations of operation 1208 begin at operation 1402 by weighting each of the two input clock signals by a number of magnitude steps based on respective MSB thermometer bits and boundary bits. In the example encoding described above, for each secondary mixer, a first subset of 61 MSB thermometer bits and two boundary bits control the magnitude steps for one input clock signal while a second subset of 61 MSB thermometer bits and two boundary bits control the steps for the other input clock signal.

At operation 1404, each input clock signal is further weighted by a number of half-steps based on a respective LSB thermometer bit. The LSB thermometer bits only change in value twice over a 360-degree phase interpolation range, providing finer phase resolution between the MSB steps.

Operation 1406 applies additional weighting to each input clock signal using half-steps based on respective LSB binary bits. Unlike the thermometer bits, the LSB binary bits may change in value more than twice over the phase range while still maintaining proper phase relationships.

At operation 1408, the secondary mixer generates a first output clock signal with a phase that represents the weighted average of the two input clock signals. The weighting combines the MSB bit and boundary bit magnitude steps with the LSB magnitude half-steps to create precise phase interpolation between the input clocks while preventing discontinuities at quadrant boundaries.

At operation 1410, the secondary mixer generates a second output clock signal that is phase-offset by 180 degrees from the first output clock signal.

In some examples, additional output clocks can be generated (e.g., for a total of four output clocks such as I, I45, Q, Q45) by performing the operations above for additional mixers, as described in greater detail above.

It will be appreciated that the adjustments of weights and computation of the weighted averages described above in operation 1206 and operation 1208 need not occur in distinct, sequential steps, but may occur as a unified process by which the input clock signals and the bits of the phase code are processed by one or more components to generate the output clock signals.

FIG. 15A and FIG. 15B illustrate alternative mixer encoding tables using mixed thermometer-binary encoding. The alternative primary mixer thermometer-binary encoding 1502 and alternative secondary mixer thermometer-binary encoding 1504 can be used in place of the primary and secondary mixer encodings of FIG. 11A and FIG. 11B to attempt to address the limitations of a thermometer-only encoding (such as primary mixer thermometer encoding 900 in FIG. 9A) without using boundary bits, and only using 8 LSB bits instead of 16.

Each phase code 1506 value corresponds to a row of the tables, as in the other examples above.

The primary mixers are controlled using alternative primary mixer thermometer-binary encoding 1502. The values shown are for the I-mixer 802, which uses input clocks in the order I, Q, Ib, Qb; as in the examples above, the Q-mixer (e.g., interpolator mixer 302) uses the input clocks in the order Q, I-b, Q-b, I, and the phase controls remain the same.

To generate the I clock weight 1512, the MSB thermometer bits 1508 span bits <63:0>, controlling coarse phase steps. The LSB binary bits 1510 provide additional fine control without using LSB thermometer bits. At phase code 0, the I mixer MSB bits are set to 64 while other mixers' bits are 0, generating an I-clock output phase.

Each other weight follows the same pattern: Q clock weight 1514 uses MSB thermometer bits 1508 <127:64>, I-bar clock weight 1516 uses MSB thermometer bits 1508 <191:128>, and Q-bar clock weight 1518 uses MSB thermometer bits 1508<255:192>.

The alternative secondary mixer thermometer-binary encoding 1504 implements a similar structure but with redistributed bit ranges to maintain a 45-degree offset.

The secondary mixers are controlled using alternative secondary mixer thermometer-binary encoding 1504. The values shown are for the I45-mixer 826; as in the examples above, the Q45-mixer (e.g., interpolator mixer 304) will exchange the I clock and Q clock, and exchange the I-bar clock and Q-bar clock, while retaining the same pattern of control bits. Thus, whereas the input clocks to the I45-mixer are I, Q, Ib, Qb, the clock inputs to the Q45-mixer are Q, Ib, Qb, I.

To generate the I clock weight 1512, the MSB thermometer bits 1508 span bits <224:255> and <0:31>, controlling coarse phase steps. The LSB binary bits 1510 provide additional fine control without using LSB thermometer bits.

Each other weight follows the same pattern: Q clock weight 1514 uses MSB thermometer bits 1508 <127:64>, I-bar clock weight 1516 uses MSB thermometer bits 1508 <191:128>, and Q-bar clock weight 1518 uses MSB thermometer bits 1508 <255:192>.

Unlike the previous mixed thermometer-binary-boundary encoding, this alternative approach eliminates the LSB thermometer bits and boundary bits, relying solely on MSB thermometer bits and LSB binary bits for phase control. At phase code transitions, the MSB thermometer bits provide monotonic phase progression while the LSB binary bits provide fine resolution. This alternative approach can further reduce routing complexity compared to implementations using additional thermometer and boundary bits.

In some semiconductor manufacturing process technologies, the physical implementation of MSB thermometer and separate LSB binary can present a higher mismatch for binary bits, which can degrade INL. To mitigate this, using more thermometer LSB bits along with a relatively small number of binary LSB bits can improve layout matching and thereby reduce random mismatch effects on INL performance of phase interpolators.

An example machine architecture will now be described, providing examples suitable for implementing control logic for performing one or more of the operations of the method 1200 described above as instructions executed by one or more processors of a system, such as the machine described with reference to FIG. 16. In some examples, one or more of the signals described above can be generated by firmware or other software instructions executed by a machine, as described below.

FIG. 16 is a diagrammatic representation of the machine 1600 within which instructions 1602 (e.g., software, a program, an application, an applet, an app, or other executable code) for causing the machine 1600 to perform any one or more of the methodologies discussed herein may be executed. For example, the instructions 1602 may cause the machine 1600 to execute any one or more operations of the methods described herein, and/or to implement one or more components or functions of the systems described herein. The instructions 1602 transform the general, non-programmed machine 1600 into a particular machine 1600 programmed to carry out the described and illustrated functions in the manner described. The machine 1600 may operate as a standalone device or may be coupled (e.g., networked) to other machines. In a networked deployment, the machine 1600 may operate in the capacity of a server machine or a client machine in a server-client network environment, or as a peer machine in a peer-to-peer (or distributed) network environment. The machine 1600 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 1602, sequentially or otherwise, that specify actions to be taken by the machine 1600. Further, while a single machine 1600 is illustrated, the term "machine" shall also be taken to include a collection of machines that individually or jointly execute the instructions 1602 to perform any one or more of the methodologies discussed herein. In some examples, the machine 1600 may comprise both client and server systems, with certain operations of a particular method or algorithm being performed on the server-side and with certain operations of the particular method or algorithm being performed on the client-side.

The machine 1600 may include processors 1604, memory 1606, and input/output I/O components 1608, which may be configured to communicate with each other via a bus 1610. In an example, the processors 1604 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application Specific Integrated Circuit (ASIC), a Radio-Frequency Integrated Circuit (RFIC), another processor, or any suitable combination thereof) may include, for example, a processor 1612 and a processor 1614 that execute the instructions 1602. The term "processor" is intended to include multi-core processors that may comprise two or more independent processors (sometimes referred to as "cores") that may execute instructions contemporaneously. Although FIG. 16 shows multiple processors 1604, the machine 1600 may include a single processor with a single-core, a single processor with multiple cores (e.g., a multi-core processor), multiple processors with a single core, multiple processors with multiples cores, or any combination thereof.

The memory 1606 includes a main memory 1616, a static memory 1618, and a storage unit 1620, both accessible to the processors 1604 via the bus 1610. The main memory 1606, the static memory 1618, and storage unit 1620 store the instructions 1602 embodying any one or more of the methodologies or functions described herein. The instructions 1602 may also reside, completely or partially, within the main memory 1616, within the static memory 1618, within machine-readable medium 1622 within the storage unit 1620, within at least one of the processors 1604 (e.g., within the processor's cache memory), or any suitable combination thereof, during execution thereof by the machine 1600.

The I/O components 1608 may include a wide variety of components to receive input, provide output, produce output, transmit information, exchange information, capture measurements, and so on. The specific I/O components 1608 that are included in a particular machine will depend on the type of machine. For example, portable machines such as mobile phones may include a touch input device or other such input mechanisms, while a headless server machine will likely not include such a touch input device. It will be appreciated that the I/O components 1608 may include many other components that are not shown in FIG. 16. In various examples, the I/O components 1608 may include user output components 1624 and user input components 1626. The user output components 1624 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 1626 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

Communication may be implemented using a wide variety of technologies. The I/O components 1608 further include communication components 1628 operable to couple the machine 1600 to a network 1630 or devices 1632 via respective coupling or connections. For example, the communication components 1628 may include a network interface component or another suitable device to interface with the network 1630. In further examples, the communication components 1628 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1632 may be another machine or any of a wide variety of peripheral devices (e.g., a peripheral device coupled via a USB).

Moreover, the communication components 1628 may detect identifiers or include components operable to detect identifiers. For example, the communication components 1628 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph™, MaxiCode, PDF417, Ultra Code, UCC RSS-2D bar code, and other optical codes), or acoustic detection components (e.g., microphones to identify tagged audio signals). In addition, a variety of information may be derived via the communication components 1628, such as location via Internet Protocol (IP) geolocation, location via Wi-Fi® signal triangulation, location via detecting an NFC beacon signal that may indicate a particular location, and so forth.

The various memories (e.g., main memory 1616, static memory 1618, and memory of the processors 1604) and storage unit 1620 may store one or more sets of instructions and data structures (e.g., software) embodying or used by any one or more of the methodologies or functions described herein. These instructions (e.g., the instructions 1602), when executed by processors 1604, cause various operations to implement the disclosed examples.

The instructions 1602 may be transmitted or received over the network 1630, using a transmission medium, via a network interface device (e.g., a network interface component included in the communication components 1628) and using any one of several well-known transfer protocols (e.g., hypertext transfer protocol (HTTP)). Similarly, the instructions 1602 may be transmitted or received using a transmission medium via a coupling (e.g., a peer-to-peer coupling) to the devices 1632.

Although the embodiments of the present disclosure have been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art, upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended; that is, a system, device, article, or process that includes elements in addition to those listed after such a term in a claim is still deemed to fall within the scope of that claim.

In view of the disclosure above, various examples are set forth below. It should be noted that one or more features of an example, taken in isolation or combination, should be considered within the disclosure of this application.

Example 1 is a method for controlling a phase interpolator to interpolate input clock signals, the method comprising: receiving four input clock signals phase-offset by 90 degrees to span 360 degrees; at each primary mixer of two primary mixers, interpolating between a pair of the input clock signals by: adjusting a phase value based on most-significant-bit (MSB) thermometer bits; and adjusting the phase value based on least-significant-bit (LSB) thermometer bits and LSB binary bits; at each secondary mixer of two secondary mixers, interpolating between a pair the of input clock signals by: adjusting a phase value based on MSB thermometer bits and boundary bits; and adjusting the phase value based on LSB thermometer bits and LSB binary bits; and at each primary and secondary mixer: generating a first output clock signal at the phase value of the respective mixer; and generating a second output clock signal offset from the first output clock signal by 180 degrees, thereby generating eight output clock signals phase-offset by 45 degrees to span 360 degrees.

In Example 2, the subject matter of Example 1 includes, wherein: the MSB thermometer bits, the LSB thermometer bits, the LSB binary bits, and the boundary bits define a mixed thermometer-binary phase interpolator code; the adjusting of the phase value based on the MSB thermometer bits comprises interpolating between phases of the pair of input clock signals by a number of steps based on a plurality of most-significant-bit (MSB) thermometer bits of the mixed thermometer-binary phase interpolator code; the adjusting of the phase value based on the boundary bits comprises interpolating between phases of the pair of input clock signals by a number of steps based on a plurality of boundary bits of the mixed thermometer-binary phase interpolator code; the adjusting of the phase value based on the LSB thermometer bits comprises interpolating between phases of the pair of input clock signals by a number of half-steps based on at least one LSB thermometer bit of the mixed thermometer-binary phase interpolator code; and the adjusting of the phase value based on the LSB binary bits comprises interpolating between phases of the pair of input clock signals by a number of half-steps based on at least one LSB binary bit of the mixed thermometer-binary phase interpolator code.

In Example 3, the subject matter of Example 2 includes, receiving the four input clock signals at each primary mixer and each secondary mixer; receiving the mixed thermometer-binary phase interpolator code at a decoder of the phase interpolator; and decoding the mixed thermometer-binary phase interpolator code at the decoder to generate a first weight and a second weight for each primary mixer and each secondary mixer, wherein, at each primary mixer and each secondary mixer, the first weight and second weight are applied to the pair of input clock signals to interpolate between the pair of input clock signals.

In Example 4, the subject matter of Example 3 includes, wherein: at each primary mixer and each secondary mixer: the adjusting of the phase value based on the plurality of MSB thermometer bits comprises: adjusting a magnitude of the first weight by a number of steps equal to a value of a first subset of the MSB thermometer bits; and adjusting a magnitude of the second weight by a number of steps equal to a value of a second subset of the MSB thermometer bits; the adjusting of the phase value based on the at least one LSB thermometer bit comprises: adjusting the magnitude of the first weight by a number of half-steps equal to a value of a first bit of the at least one LSB thermometer bit; and adjusting the magnitude of the second weight by a number of half-steps equal to a value of a second bit of the at least one LSB thermometer bit; and the adjusting of the phase value based on the at least one LSB binary bit comprises: adjusting the magnitude of the first weight by a number of half-steps equal to a value of a first bit of the at least one LSB binary bit; and adjusting the magnitude of the second weight by a number of half-steps equal to a value of a second bit of the at least one LSB binary bit.

In Example 5, the subject matter of Example 4 includes, wherein: the mixed thermometer-binary phase interpolator code spans 360 degrees; each of the MSB thermometer bits and each of the LSB thermometer bits only changes in value twice over a 360-degree span; each of the boundary bits only changes in value twice over a 360-degree span; and each of the LSB binary bits changes in value more than twice over a 360-degree span.

In Example 6, the subject matter of Example 5 includes, wherein: at each secondary mixer: the adjusting of the phase value based on the plurality of boundary bits comprises: adjusting the magnitude of the first weight by a number of steps equal to values of a first bit and a second bit of the plurality of boundary bits; and adjusting the magnitude of the second weight by a number of steps equal to a value of a third bit and a fourth bit of the plurality of boundary bits.

In Example 7, the subject matter of Example 6 includes, wherein: the plurality of MSB thermometer bits consists of 252 MSB thermometer bits; the first subset and second subset of the MSB thermometer bits used by each primary mixer each consist of 63 MSB thermometer bits; and the first subset and second subset of the MSB thermometer bits used by each secondary mixer each consist of 61 MSB thermometer bits.

In Example 8, the subject matter of Example 7 includes, wherein: the first subset and second subset of the MSB thermometer bits used by each secondary mixer each consist of: 30 of the MSB thermometer bits of a first one of the subsets of the MSB thermometer bits used by one of the primary mixers; and 31 of the MSB thermometer bits of an other one of the subsets of the MSB thermometer bits used by one of the primary mixers.

In Example 9, the subject matter of Examples 2-8 includes, wherein: the mixed thermometer-binary phase interpolator code consists of: 252 MSB thermometer bits; 8 LSB thermometer bits; 8 LSB binary bits; and 8 boundary bits.

Example 10 is a phase interpolator for interpolating four input clock signals phase-offset by 90 degrees to span 360 degrees, the phase interpolator comprising: two primary mixer to each interpolate between a pair of the input clock signals by: adjusting a phase value based on most-significant-bit (MSB) thermometer bits; and adjusting the phase value based on least-significant-bit (LSB) thermometer bits and LSB binary bits; and two secondary mixers to each interpolate between a pair the of input clock signals by: adjusting a phase value based on MSB thermometer bits and boundary bits; and adjusting the phase value based on LSB thermometer bits and LSB binary bits; and wherein each primary and secondary mixer: generates a first output clock signal at the phase value of the respective mixer; and generates a second output clock signal offset from the first output clock signal by 180 degrees, thereby generating eight output clock signals phase-offset by 45 degrees to span 360 degrees.

In Example 11, the subject matter of Example 10 includes, wherein: the MSB thermometer bits, the LSB thermometer bits, the LSB binary bits, and the boundary bits define a mixed thermometer-binary phase interpolator code; the adjusting of the phase value based on the MSB thermometer bits comprises interpolating between phases of the pair of input clock signals by a number of steps based on a plurality of most-significant-bit (MSB) thermometer bits of the mixed thermometer-binary phase interpolator code; the adjusting of the phase value based on the boundary bits comprises interpolating between phases of the pair of input clock signals by a number of steps based on a plurality of boundary bits of the mixed thermometer-binary phase interpolator code; the adjusting of the phase value based on the LSB thermometer bits comprises interpolating between phases of the pair of input clock signals by a number of half-steps based on at least one LSB thermometer bit of the mixed thermometer-binary phase interpolator code; and the adjusting of the phase value based on the LSB binary bits comprises interpolating between phases of the pair of input clock signals by a number of half-steps based on at least one LSB binary bit of the mixed thermometer-binary phase interpolator code.

In Example 12, the subject matter of Example 11 includes, a decoder to receive and decode the mixed thermometer-binary phase interpolator code to generate a first weight and a second weight for each primary mixer and each secondary mixer, wherein: each primary mixer and each secondary mixer receives the four input clock signals; and at each primary mixer and each secondary mixer, the first weight and second weight are applied to the pair of input clock signals to interpolate between the pair of input clock signals.

In Example 13, the subject matter of Example 12 includes, wherein: at each primary mixer and each secondary mixer: the adjusting of the phase value based on the plurality of MSB thermometer bits comprises: adjusting a magnitude of the first weight by a number of steps equal to a value of a first subset of the MSB thermometer bits; and adjusting a magnitude of the second weight by a number of steps equal to a value of a second subset of the MSB thermometer bits; the adjusting of the phase value based on the at least one LSB thermometer bit comprises: adjusting the magnitude of the first weight by a number of half-steps equal to a value of a first bit of the at least one LSB thermometer bit; and adjusting the magnitude of the second weight by a number of half-steps equal to a value of a second bit of the at least one LSB thermometer bit; and the adjusting of the phase value based on the at least one LSB binary bit comprises: adjusting the magnitude of the first weight by a number of half-steps equal to a value of a first bit of the at least one LSB binary bit; and adjusting the magnitude of the second weight by a number of half-steps equal to a value of a second bit of the at least one LSB binary bit.

In Example 14, the subject matter of Example 13 includes, wherein: the mixed thermometer-binary phase interpolator code spans 360 degrees; each of the MSB thermometer bits and each of the LSB thermometer bits only changes in value twice over a 360-degree span; and each of the LSB binary bits changes in value more than twice over a 360-degree span.

In Example 15, the subject matter of Example 14 includes, wherein: at each secondary mixer: the adjusting of the phase value based on the plurality of boundary bits comprises: adjusting the magnitude of the first weight by a number of steps equal to values of a first bit and a second bit of the plurality of boundary bits; and adjusting the magnitude of the second weight by a number of steps equal to a value of a third bit and a fourth bit of the plurality of boundary bits.

In Example 16, the subject matter of Example 15 includes, wherein: each of the boundary bits only changes in value twice over a 360-degree span.

In Example 17, the subject matter of Example 16 includes, wherein: the plurality of MSB thermometer bits consists of 252 MSB thermometer bits; the first subset and second subset of the MSB thermometer bits used by each primary mixer each consist of 63 MSB thermometer bits; and the first subset and second subset of the MSB thermometer bits used by each secondary mixer each consist of 61 MSB thermometer bits.

In Example 18, the subject matter of Example 17 includes, wherein: the first subset and second subset of the MSB thermometer bits used by each secondary mixer each consist of: 30 of the MSB thermometer bits of a first one of the subsets of the MSB thermometer bits used by one of the primary mixers; and 31 of the MSB thermometer bits of an other one of the subsets of the MSB thermometer bits used by one of the primary mixers.

In Example 19, the subject matter of Examples 11-18 includes, wherein: the mixed thermometer-binary phase interpolator code consists of: 252 MSB thermometer bits; 8 LSB thermometer bits; 8 LSB binary bits; and 8 boundary bits.

Example 20 is a method for controlling a phase interpolator to interpolate four input clock signals to generate eight output clock signals, the four input clock signals being phase-offset from each other by increments of 90 degrees to span 360 degrees, each of the eight output clock signals being phase-offset from each other by increments of 45 degrees to span 360 degrees, the phase interpolator comprising two primary mixers and two secondary mixers, the method comprising: generating a mixed thermometer-binary phase interpolator code configured to cause the generation of a first output clock signal of the eight output clock signals by a first one of the primary mixers, and to cause the generation of a second output clock signal of the eight output clock signals by a first one of the secondary mixers, a phase value of the second output clock signal being offset from a phase value of the first output clock signal by 45 degrees; and transmitting the mixed thermometer-binary phase interpolator code to the phase interpolator, wherein: the first one of the primary mixers determines the phase value of the first output clock signal by: interpolating between a pair of input clock signals of the four input clock signals based on a mixed thermometer-binary phase interpolator code by: adjusting the phase value between phases of the pair of input clock signals by a number of steps based on a plurality of most-significant-bit (MSB) thermometer bits of the mixed thermometer-binary phase interpolator code; and adjusting the phase value by a number of half-steps based on at least one least-significant-bit (LSB) thermometer bit and at least one LSB binary bit of the mixed thermometer-binary phase interpolator code; and the first one of the secondary mixers determines the phase value of the second output clock signal by: interpolating between a pair of input clock signals of the four input clock signals based on the mixed thermometer-binary phase interpolator code by: adjusting the phase value between phases of the pair of input clock signals by a number of steps based on a plurality of MSB thermometer bits and a plurality of boundary bits of the mixed thermometer-binary phase interpolator code; and adjusting the phase value by a number of half-steps based on at least one LSB thermometer bit and at least one LSB binary bit of the mixed thermometer-binary phase interpolator code.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

"Component" refers, for example, to a device, physical entity, or logic having boundaries defined by function or subroutine calls, branch points, APIs, or other technologies that provide for the partitioning or modularization of particular processing or control functions. Components may be combined via their interfaces with other components to carry out a machine process. A component may be a packaged functional hardware unit designed for use with other components and a part of a program that usually performs a particular function of related functions. Components may constitute either software components (e.g., code embodied on a machine-readable medium) or hardware components. A "hardware component" is a tangible unit capable of performing certain operations and may be configured or arranged in a certain physical manner. In various examples, one or more computer systems (e.g., a standalone computer system, a client computer system, or a server computer system) or one or more hardware components of a computer system (e.g., a processor or a group of processors) may be configured by software (e.g., an application or application portion) as a hardware component that operates to perform certain operations as described herein. A hardware component may also be implemented mechanically, electronically, or any suitable combination thereof. For example, a hardware component may include dedicated circuitry or logic that is permanently configured to perform certain operations. A hardware component may be a special-purpose processor, such as a field-programmable gate array (FPGA) or an application-specific integrated circuit (ASIC). A hardware component may also include programmable logic or circuitry that is temporarily configured by software to perform certain operations. For example, a hardware component may include software executed by a general-purpose processor or other programmable processors. Once configured by such software, hardware components become specific machines (or specific components of a machine) uniquely tailored to perform the configured functions and are no longer general-purpose processors. It will be appreciated that the decision to implement a hardware component mechanically, in dedicated and permanently configured circuitry, or in temporarily configured circuitry (e.g., configured by software), may be driven by cost and time considerations. Accordingly, the phrase "hardware component" (or "hardware-implemented component") should be understood to encompass a tangible entity, be that an entity that is physically constructed, permanently configured (e.g., hardwired), or temporarily configured (e.g., programmed) to operate in a certain manner or to perform certain operations described herein. Considering examples in which hardware components are temporarily configured (e.g., programmed), each of the hardware components need not be configured or instantiated at any one instance in time. For example, where a hardware component comprises a general-purpose processor configured by software to become a special-purpose processor, the general-purpose processor may be configured as respectively different special-purpose processors (e.g., comprising different hardware components) at different times. Software accordingly configures a particular processor or processors, for example, to constitute a particular hardware component at one instance of time and to constitute a different hardware component at a different instance of time. Hardware components can provide information to, and receive information from, other hardware components. Accordingly, the described hardware components may be regarded as being communicatively coupled. Where multiple hardware components exist contemporaneously, communications may be achieved through signal transmission (e.g., over appropriate circuits and buses) between or among two or more of the hardware components. In examples in which multiple hardware components are configured or instantiated at different times, communications between such hardware components may be achieved, for example, through the storage and retrieval of information in memory structures to which the multiple hardware components have access. For example, one hardware component may perform an operation and store the output of that operation in a memory device to which it is communicatively coupled. A further hardware component may then, at a later time, access the memory device to retrieve and process the stored output. Hardware components may also initiate communications with input or output devices, and can operate on a resource (e.g., a collection of information). The various operations of example methods described herein may be performed, at least partially, by one or more processors that are temporarily configured (e.g., by software) or permanently configured to perform the relevant operations. Whether temporarily or permanently configured, such processors may constitute processor-implemented components that operate to perform one or more operations or functions described herein. As used herein, "processor-implemented component" refers to a hardware component implemented using one or more processors. Similarly, the methods described herein may be at least partially processor-implemented, with a particular processor or processors being an example of hardware. For example, at least some of the operations of a method may be performed by one or more processors or processor-implemented components. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the processors, not only residing within a single machine, but deployed across a number of machines. In some examples, the processors or processor-implemented components may be located in a single geographic location (e.g., within a home environment, an office environment, or a server farm). In other examples, the processors or processor-implemented components may be distributed across a number of geographic locations.

"Computer-readable storage medium" refers, for example, to both machine-storage media and transmission media. Thus, the terms include both storage devices/media and carrier waves/modulated data signals. The terms "machine-readable medium," "computer-readable medium" and "device-readable medium" mean the same thing and may be used interchangeably in this disclosure.

"Machine storage medium" refers, for example, to a single or multiple storage devices and media (e.g., a centralized or distributed database, and associated caches and servers) that store executable instructions, routines and data. The term shall accordingly be taken to include, but not be limited to, solid-state memories, and optical and magnetic media, including memory internal or external to processors. Specific examples of machine-storage media, computer-storage media and device-storage media include non-volatile memory, including by way of example semiconductor memory devices, e.g., erasable programmable read-only memory (EPROM), electrically erasable programmable read-only memory (EEPROM), FPGA, and flash memory devices; magnetic disks such as internal hard disks and removable disks; magneto-optical disks; and CD-ROM and DVD-ROM disks The terms "machine-storage medium," "device-storage medium," "computer-storage medium" mean the same thing and may be used interchangeably in this disclosure. The terms "machine-storage media," "computer-storage media," and "device-storage media" specifically exclude carrier waves, modulated data signals, and other such media, at least some of which are covered under the term "signal medium."

"Non-transitory computer-readable storage medium" refers, for example, to a tangible medium that is capable of storing, encoding, or carrying the instructions for execution by a machine.

"Signal medium" refers, for example, to any intangible medium that is capable of storing, encoding, or carrying the instructions for execution by a machine and includes digital or analog communications signals or other intangible media to facilitate communication of software or data. The term "signal medium" shall be taken to include any form of a modulated data signal, carrier wave, and so forth. The term "modulated data signal" means a signal that has one or more of its characteristics set or changed in such a matter as to encode information in the signal. The terms "transmission medium" and "signal medium" mean the same thing and may be used interchangeably in this disclosure.

What is claimed is:

1. A method for controlling a phase interpolator to interpolate input clock signals, the method comprising:
   receiving four input clock signals phase-offset by 90 degrees to span 360 degrees;
   at each primary mixer of two primary mixers, interpolating between a pair of the input clock signals by:
      adjusting a phase value based on most-significant-bit (MSB) thermometer bits; and
      adjusting the phase value based on least-significant-bit (LSB) thermometer bits and LSB binary bits;
   at each secondary mixer of two secondary mixers, interpolating between a pair the of input clock signals by:
      adjusting a phase value based on MSB thermometer bits and boundary bits; and
      adjusting the phase value based on LSB thermometer bits and LSB binary bits; and
   at each primary and secondary mixer:
      generating a first output clock signal at the phase value of the respective mixer; and
      generating a second output clock signal offset from the first output clock signal by 180 degrees,
   thereby generating eight output clock signals phase-offset by 45 degrees to span 360 degrees.

2. The method of claim 1, wherein:
   the MSB thermometer bits, the LSB thermometer bits, the LSB binary bits, and the boundary bits define a mixed thermometer-binary phase interpolator code;
   the adjusting of the phase value based on the MSB thermometer bits comprises interpolating between phases of the pair of input clock signals by a number of steps based on a plurality of most-significant-bit (MSB) thermometer bits of the mixed thermometer-binary phase interpolator code;
   the adjusting of the phase value based on the boundary bits comprises interpolating between phases of the pair of input clock signals by a number of steps based on a plurality of boundary bits of the mixed thermometer-binary phase interpolator code;
   the adjusting of the phase value based on the LSB thermometer bits comprises interpolating between phases of the pair of input clock signals by a number of half-steps based on at least one LSB thermometer bit of the mixed thermometer-binary phase interpolator code; and
   the adjusting of the phase value based on the LSB binary bits comprises interpolating between phases of the pair of input clock signals by a number of half-steps based on at least one LSB binary bit of the mixed thermometer-binary phase interpolator code.

3. The method of claim 2, further comprising:
   receiving the four input clock signals at each primary mixer and each secondary mixer;
   receiving the mixed thermometer-binary phase interpolator code at a decoder of the phase interpolator; and
   decoding the mixed thermometer-binary phase interpolator code at the decoder to generate a first weight and a second weight for each primary mixer and each secondary mixer, wherein, at each primary mixer and each secondary mixer, the first weight and second weight are applied to the pair of input clock signals to interpolate between the pair of input clock signals.

4. The method of claim 3, wherein:
   at each primary mixer and each secondary mixer:
      the adjusting of the phase value based on the plurality of MSB thermometer bits comprises:
         adjusting a magnitude of the first weight by a number of steps equal to a value of a first subset of the MSB thermometer bits; and
         adjusting a magnitude of the second weight by a number of steps equal to a value of a second subset of the MSB thermometer bits;
      the adjusting of the phase value based on the at least one LSB thermometer bit comprises:
         adjusting the magnitude of the first weight by a number of half-steps equal to a value of a first bit of the at least one LSB thermometer bit; and
         adjusting the magnitude of the second weight by a number of half-steps equal to a value of a second bit of the at least one LSB thermometer bit; and
      the adjusting of the phase value based on the at least one LSB binary bit comprises:
         adjusting the magnitude of the first weight by a number of half-steps equal to a value of a first bit of the at least one LSB binary bit; and
         adjusting the magnitude of the second weight by a number of half-steps equal to a value of a second bit of the at least one LSB binary bit.

5. The method of claim 4, wherein:
   the mixed thermometer-binary phase interpolator code spans 360 degrees;
   each of the MSB thermometer bits and each of the LSB thermometer bits only changes in value twice over a 360-degree span;
   each of the boundary bits only changes in value twice over a 360-degree span; and
   each of the LSB binary bits change in value more than twice over a 360-degree span.

6. The method of claim 5, wherein:
   at each secondary mixer:
      the adjusting of the phase value based on the plurality of boundary bits comprises:
         adjusting the magnitude of the first weight by a number of steps equal to values of a first bit and a second bit of the plurality of boundary bits; and
         adjusting the magnitude of the second weight by a number of steps equal to a value of a third bit and a fourth bit of the plurality of boundary bits.

7. The method of claim 6, wherein:
   the plurality of MSB thermometer bits consists of 252 MSB thermometer bits;
   the first subset and second subset of the MSB thermometer bits used by each primary mixer each consist of 63 MSB thermometer bits; and
   the first subset and second subset of the MSB thermometer bits used by each secondary mixer each consist of 61 MSB thermometer bits.

8. The method of claim 7, wherein:
   the first subset and second subset of the MSB thermometer bits used by each secondary mixer each consist of:
      30 of the MSB thermometer bits of a first one of the subsets of the MSB thermometer bits used by one of the primary mixers; and 31 of the MSB thermometer bits of an other one of the subsets of the MSB thermometer bits used by one of the primary mixers.

9. The method of claim 2, wherein:

the mixed thermometer-binary phase interpolator code consists of:

252 MSB thermometer bits;

8 LSB thermometer bits;

8 LSB binary bits; and 8 boundary bits.

10. A phase interpolator for interpolating four input clock signals phase-offset by 90 degrees to span 360 degrees, the phase interpolator comprising:

two primary mixer to each interpolate between a pair of the input clock signals by:

adjusting a phase value based on most-significant-bit (MSB) thermometer bits; and adjusting the phase value based on least-significant-bit (LSB) thermometer bits and LSB binary bits; and two secondary mixers to each interpolate between a pair the of input clock signals by:

adjusting a phase value based on MSB thermometer bits and boundary bits; and adjusting the phase value based on LSB thermometer bits and LSB binary bits; and wherein each primary and secondary mixer:

generates a first output clock signal at the phase value of the respective mixer; and generates a second output clock signal offset from the first output clock signal by 180 degrees, thereby generating eight output clock signals phase-offset by 45 degrees to span 360 degrees.

11. The phase interpolator of claim 10, wherein:

the MSB thermometer bits, the LSB thermometer bits, the LSB binary bits, and the boundary bits define a mixed thermometer-binary phase interpolator code;

the adjusting of the phase value based on the MSB thermometer bits comprises interpolating between phases of the pair of input clock signals by a number of steps based on a plurality of most-significant-bit (MSB) thermometer bits of the mixed thermometer-binary phase interpolator code;

the adjusting of the phase value based on the boundary bits comprises interpolating between phases of the pair of input clock signals by a number of steps based on a plurality of boundary bits of the mixed thermometer-binary phase interpolator code;

the adjusting of the phase value based on the LSB thermometer bits comprises interpolating between phases of the pair of input clock signals by a number of half-steps based on at least one LSB thermometer bit of the mixed thermometer-binary phase interpolator code; and the adjusting of the phase value based on the LSB binary bits comprises interpolating between phases of the pair of input clock signals by a number of half-steps based on at least one LSB binary bit of the mixed thermometer-binary phase interpolator code.

12. The phase interpolator of claim 11, further comprising:

a decoder to receive and decode the mixed thermometer-binary phase interpolator code to generate a first weight and a second weight for each primary mixer and each secondary mixer, wherein:

each primary mixer and each secondary mixer receives the four input clock signals; and at each primary mixer and each secondary mixer, the first weight and second weight are applied to the pair of input clock signals to interpolate between the pair of input clock signals.

13. The phase interpolator of claim 12, wherein:

at each primary mixer and each secondary mixer:

the adjusting of the phase value based on the plurality of MSB thermometer bits comprises:

adjusting a magnitude of the first weight by a number of steps equal to a value of a first subset of the MSB thermometer bits; and adjusting a magnitude of the second weight by a number of steps equal to a value of a second subset of the MSB thermometer bits;

the adjusting of the phase value based on the at least one LSB thermometer bit comprises:

adjusting the magnitude of the first weight by a number of half-steps equal to a value of a first bit of the at least one LSB thermometer bit; and adjusting the magnitude of the second weight by a number of half-steps equal to a value of a second bit of the at least one LSB thermometer bit; and the adjusting of the phase value based on the at least one LSB binary bit comprises:

adjusting the magnitude of the first weight by a number of half-steps equal to a value of a first bit of the at least one LSB binary bit; and adjusting the magnitude of the second weight by a number of half-steps equal to a value of a second bit of the at least one LSB binary bit.

14. The phase interpolator of claim 13, wherein:

the mixed thermometer-binary phase interpolator code spans 360 degrees;

each of the MSB thermometer bits and each of the LSB thermometer bits only changes in value twice over a 360-degree span; and each of the LSB binary bits changes in value more than twice over a 360-degree span.

15. The phase interpolator of claim 14, wherein:

at each secondary mixer:

the adjusting of the phase value based on the plurality of boundary bits comprises:

adjusting the magnitude of the first weight by a number of steps equal to values of a first bit and a second bit of the plurality of boundary bits; and adjusting the magnitude of the second weight by a number of steps equal to a value of a third bit and a fourth bit of the plurality of boundary bits.

16. The phase interpolator of claim 15, wherein:

each of the boundary bits only changes in value twice over a 360-degree span.

17. The phase interpolator of claim 16, wherein:

the plurality of MSB thermometer bits consists of 252 MSB thermometer bits;

the first subset and second subset of the MSB thermometer bits used by each primary mixer each consist of 63 MSB thermometer bits; and the first subset and second subset of the MSB thermometer bits used by each secondary mixer each consist of 61 MSB thermometer bits.

18. The phase interpolator of claim 17, wherein:

the first subset and second subset of the MSB thermometer bits used by each secondary mixer each consist of:

30 of the MSB thermometer bits of a first one of the subsets of the MSB thermometer bits used by one of the primary mixers; and 31 of the MSB thermometer bits of an other one of the subsets of the MSB thermometer bits used by one of the primary mixers.

19. The phase interpolator of claim 11, wherein:
the mixed thermometer-binary phase interpolator code consists of:
252 MSB thermometer bits;
8 LSB thermometer bits;
8 LSB binary bits; and
8 boundary bits.

20. A method for controlling a phase interpolator to interpolate four input clock signals to generate eight output clock signals, the four input clock signals being phase-offset from each other by increments of 90 degrees to span 360 degrees, each of the eight output clock signals being phase-offset from each other by increments of 45 degrees to span 360 degrees, the phase interpolator comprising two primary mixers and two secondary mixers, the method comprising:
generating a mixed thermometer-binary phase interpolator code configured to cause the generation of a first output clock signal of the eight output clock signals by a first one of the primary mixers, and to cause the generation of a second output clock signal of the eight output clock signals by a first one of the secondary mixers, a phase value of the second output clock signal being offset from a phase value of the first output clock signal by 45 degrees; and
transmitting the mixed thermometer-binary phase interpolator code to the phase interpolator,
wherein:

the first one of the primary mixers determines the phase value of the first output clock signal by:
interpolating between a pair of input clock signals of the four input clock signals based on a mixed thermometer-binary phase interpolator code by:
adjusting the phase value between phases of the pair of input clock signals by a number of steps based on a plurality of most-significant-bit (MSB) thermometer bits of the mixed thermometer-binary phase interpolator code; and
adjusting the phase value by a number of half-steps based on at least one least-significant-bit (LSB) thermometer bit and at least one LSB binary bit of the mixed thermometer-binary phase interpolator code; and
the first one of the secondary mixers determines the phase value of the second output clock signal by:
interpolating between a pair of input clock signals of the four input clock signals based on the mixed thermometer-binary phase interpolator code by:
adjusting the phase value between phases of the pair of input clock signals by a number of steps based on a plurality of MSB thermometer bits and a plurality of boundary bits of the mixed thermometer-binary phase interpolator code; and
adjusting the phase value by a number of half-steps based on at least one LSB thermometer bit and at least one LSB binary bit of the mixed thermometer-binary phase interpolator code.

* * * * *